United States Patent
Yang et al.

(10) Patent No.: US 10,795,809 B2
(45) Date of Patent: Oct. 6, 2020

(54) NON-VOLATILE LOGIC DEVICE FOR ENERGY-EFFICIENT LOGIC STATE RESTORATION

(71) Applicants: Jinghua Yang, Tempe, AZ (US); Sarma Vrudhula, Chandler, AZ (US); Aykut Dengi, Tempe, AZ (US)

(72) Inventors: Jinghua Yang, Tempe, AZ (US); Sarma Vrudhula, Chandler, AZ (US); Aykut Dengi, Tempe, AZ (US)

(73) Assignee: Arizona Board of Regents on Behalf of Arizona State University, Scottsdale, AZ (US)

( * ) Notice: Subject to any disclaimer, the term of this patent is extended or adjusted under 35 U.S.C. 154(b) by 23 days.

(21) Appl. No.: 16/244,613

(22) Filed: Jan. 10, 2019

(65) Prior Publication Data
US 2019/0213119 A1    Jul. 11, 2019

Related U.S. Application Data

(60) Provisional application No. 62/615,666, filed on Jan. 10, 2018.

(51) Int. Cl.
*G06F 12/02*    (2006.01)
*G06F 3/06*    (2006.01)
*H03K 19/1776*    (2020.01)

(52) U.S. Cl.
CPC ........ *G06F 12/0238* (2013.01); *G06F 3/0679* (2013.01); *H03K 19/1776* (2013.01)

(58) Field of Classification Search
CPC .............. G06F 12/0238; G06F 3/0679; G06F 12/0246; G06F 2212/1024; G06F 2212/7203; H03K 19/1776

USPC .......................................................... 326/38
See application file for complete search history.

(56) References Cited

U.S. PATENT DOCUMENTS

| | | |
|---|---|---|
| 7,630,852 B1 | 12/2009 | Ghanta et al. |
| 8,164,359 B2 | 4/2012 | Leshner et al. |
| 8,181,133 B2 | 5/2012 | Gowda et al. |
| 8,601,417 B2 | 12/2013 | Gowda et al. |
| 8,832,614 B2 | 9/2014 | Vrudhula et al. |
| 9,306,151 B2 | 4/2016 | Vrudhula et al. |

(Continued)

FOREIGN PATENT DOCUMENTS

| | | |
|---|---|---|
| WO | 2009102948 A2 | 8/2009 |
| WO | 2010048206 A1 | 4/2010 |

(Continued)

OTHER PUBLICATIONS

Balsamo, Domenico, et al., "Hibernus: Sustaining Computation during Intermittent Supply for Energy-Harvesting Systems," IEEE Embedded Systems Letters, vol. 7, Issue 1, Mar. 2015, 4 pages.

(Continued)

*Primary Examiner* — Don P Le
(74) *Attorney, Agent, or Firm* — Withrow & Terranova, P.L.L.C.

(57) ABSTRACT

A non-volatile logic device for energy-efficient logic state restoration is disclosed. The non-volatile logic device incorporates a volatile flip-flop and a non-volatile storage unit to achieve on-chip non-volatile storage. The non-volatile logic device further allows for a backup time to be determined on a per-chip basis, resulting in minimizing energy wastage and satisfying a given yield constraint.

18 Claims, 12 Drawing Sheets

(56) References Cited

U.S. PATENT DOCUMENTS

| | | | |
|---|---|---|---|
| 9,356,598 B2 | 5/2016 | Vrudhula et al. | |
| 9,466,362 B2 | 10/2016 | Yu et al. | |
| 9,473,139 B2 | 10/2016 | Vrudhula et al. | |
| 9,490,815 B2 | 11/2016 | Vrudhula et al. | |
| 9,876,503 B2 | 1/2018 | Vrudhula et al. | |
| 9,923,553 B2 * | 3/2018 | Roy | H03K 3/35625 |
| 9,933,825 B2 | 4/2018 | Hanumaiah et al. | |
| 9,934,463 B2 | 4/2018 | Seo et al. | |
| 10,133,323 B2 | 11/2018 | Hanumaiah et al. | |
| 10,250,236 B2 | 4/2019 | Vrudhula et al. | |
| 10,319,425 B1 * | 6/2019 | Jung | G11C 11/1659 |
| 10,447,249 B2 | 10/2019 | Vrudhula et al. | |
| 2012/0020159 A1 * | 1/2012 | Ong | G11C 14/0081 365/185.08 |
| 2013/0194862 A1 * | 8/2013 | Jung | G11C 14/00 365/158 |
| 2013/0286721 A1 * | 10/2013 | Jung | G11C 11/1673 365/158 |
| 2015/0213869 A1 * | 7/2015 | Wu | G11C 11/1693 365/154 |
| 2016/0322093 A1 * | 11/2016 | Ghosh | G11C 11/1675 |
| 2016/0329100 A1 * | 11/2016 | Javerliac | G11C 11/005 |
| 2017/0229179 A1 * | 8/2017 | Sugahara | G11C 14/0081 |
| 2017/0248989 A1 | 8/2017 | Vrudhula et al. | |
| 2018/0025765 A1 * | 1/2018 | Yokoyama | H01L 27/228 365/158 |
| 2018/0158500 A1 * | 6/2018 | Usami | G11C 11/412 |
| 2019/0325961 A1 * | 10/2019 | Jaiswal | G11C 11/1655 |
| 2019/0333574 A1 * | 10/2019 | Shuto | G11C 11/413 |

FOREIGN PATENT DOCUMENTS

| | | |
|---|---|---|
| WO | 2014151323 A1 | 9/2014 |
| WO | 2015006342 A1 | 1/2015 |
| WO | 2016191383 A1 | 12/2016 |
| WO | 2016191385 A1 | 12/2016 |
| WO | 2017190089 A1 | 11/2017 |

OTHER PUBLICATIONS

Bishnoi, Rajendra, et al., "Design of Defect and Fault-Tolerant Nonvolatile Spintronic Flip-Flops," IEEE Transactions on Very Large Scale Integration (VLSI) Systems, 2016, 12 pages.

Bishnoi, Rajendra, et al., "Improving Write Performance for STT-MRAM," IEEE Transactions on Magnetics, vol. 52, Issue 8, Aug. 2016, 11 pages.

Bishnoi, Rajendra, et al., "Non-Volatile Non-Shadow Flip-Flop using Spin Orbit Torque for Efficient Normally-off Computing," 21st Asia and South Pacific Design Automation Conference, Jan. 2016, IEEE, pp. 769-774.

Bishnoi, Rajendra, et al., "Read Disturb Fault Detection in STT-MRAM," International Test Conference, Oct. 2014, IEEE, pp. 1-7.

Currivan-Incorvia, J.A., et al., "Logic circuit prototypes for three-terminal magnetic tunnel junctions with mobile domain walls," Nature Communations, vol. 7, Jan. 2016, 7 pages.

Khanna, Sudhanshu, et al., "An FRAM-Based Nonvolatile Logic MCU SoC Exhibiting 100% Digital State Retention at VDD = 0 V Achieving Zero Leakage with <400-ns Wakeup Time for ULP Applications," IEEE Journal of Solid-State Circuits, vol. 49, Issue 1, Jan. 2014, pp. 95-106.

Koga, Masahiro, et al., "First Prototype of a Genuine Power-Gatable Reconfigurable Logic Chip with FeRAM cells," International Conference on Field Programmable Logic and Applications, Aug. 2010, IEEE, pp. 298-303.

Kulkarni, et al., "Reducing Power, Leakage, and Area of Standard-Cell ASICs Using Threshold Logic Flip-Flops," IEEE Transactions on Very Large Scale Integration (VLSI) Systems, vol. 24, Issue 9, Sep. 2016, 14 pages.

Kwon, Kon-Woo, et al., "SHE-NVFF: Spin Hall Effect-Based Nonvolatile Flip-Flop for Power Gating Architecture," IEEE Electron Device Letters, vol. 35, Issue 4, Apr. 2014, pp. 488-490.

Garello, Kevin, et al., "Ultrafast magnetization switching by spin-orbit torques," Applied Physics Letters, vol. 105, Issue 21, Nov. 2014, 12 pages.

Halawani, Yasmin, et al., "Modeling and Optimization of Memristor and STT-RAM-Based Memory for Low-Power Applications," IEEE Transactions on Very Large Scale Integration (VLSI) Systems, 2015, 12 pages.

Huang, Kejie, et al., "STT-MRAM based Low Power Synchronous Non-volatile Logic with Timing Demultiplexing," IEEE/ACM International Symposium on Nanoscale Architectures, Jul. 2014, pp. 31-36.

Ma, Kaisheng, et al., "Architecture Exploration for Ambient Energy Harvesting Nonvolatile Processors," 21st International Symposium on High Performance Computer Architecture, Feb. 2015, IEEE, pp. 526-537.

Miron, Ioan, et al., "Perpendicular switching of a single ferromagnetic layer induced by in-plane current injection," Nature, vol. 476, Aug. 2011, Macmillan Publishers Limited, pp. 189-194.

Mittal, Sparsh, et al., "A Survey of Architectural Approaches for Managing Embedded DRAM and Non-volatile On-chip Caches," IEEE Transactions on Parallel and Distributed Systems, vol. 26, Issue 6, Jun. 2015, 14 pages.

Motaman, et al., "Impact of Process-Variations in STTRAM and Adaptive Boosting for Robustness," Design, Automation & Test in Europe Conference & Exhibition, Mar. 2015, pp. 1431-1436.

Munira, Kamaram, et al., "A quasi-analytical model for energy-delay-reliability tradeoff studies during write operations in a perpendicular STT-RAM cell," Journal of Latex Class Files, vol. 6, Issue 1, 2007, 6 pages.

Natsui, Masanori, et al., "Nonvolatile Logic-in-Memory Array Processor in 90nm MTJ/MOS Achieving 75% Leakage Reduction Using Cycle-Based Power Gating," International Solid-State Circuits Conference, Digest of Technical Papers, Feb. 2013, pp. 194-196.

Ota, K., et al., "Impact of the Filament Morphology on the Retention Characteristics of Cu/Al2O3-based CBRAM devices," International Electron Devices Meeting, Dec. 2016, 4 pages.

Prenat, Guillaume, et al., "Ultra-Fast and High-Reliability SOT-MRAM: From Cache Replacement to Normally-Off Computing," IEEE Transactions on Multi-Scale Computing Systems, vol. 2, Issue 1, Jan. 2016, pp. 49-60.

Priya, et al., "Energy Harvesting Technologies," 1st edition, Springer Publishing Company, Incorporated, 2009, 522 pages.

Raychowdhury, Arijit, et al., "Design Space and Scalability Exploration of 1T-1STT MTJ Memory Arrays in the Presence of Variability and Disturbances," International Electron Devices Meeting, Dec. 2009, IEEE, 4 pages.

Ryu, Kyungho, et al., "A Magnetic Tunnel Junction Based Zero Standby Leakage Current Retention Flip-Flop," IEEE Transactions on Very Large Scale Integration (VLSI) Systems, vol. 20, Issue 11, Nov. 2012, pp. 2044-2053.

Sun, J.Z., et al., "Effect of subvolume excitation and spin-torque efficiency on magnetic switching," Physical Review B, vol. 84, Aug. 2011, American Physical Society, 9 pages.

Wang, Yiqun, et al., "A 3us Wake-up Time Nonvolatile Processor Based on Ferroelectric Flip-Flops," European Solid State Circuits Conference, Sep. 2012, IEEE, pp. 149-152.

Wang, et al., "Compact model of magnetic tunnel junction with stochastic spin transfer torque switching for reliability analyses," Microelectronics Reliability, vol. 54, 2014, pp. 1774-1778.

Wang, Shaodi, et al., "Comparative Evaluation of Spin-Transfer-Torque and Magnetoelectri Random Access Memory," IEEE Journal on Emerging and Selected Topics in Circuits and Systems, vol. 6, Issue 2, Jun. 2016, 12 pages.

Weste, Neil, et al., "CMOS VLSI Design: A Circuit and Systems Perspective," Fourth Edition, Pearson Education, Inc., 2011, 867 pages.

Wirnshofer, Martin, "Variation-Aware Adaptive Voltage Scaling for Digital CMOS Circuits," Springer Series in Advanced Microelectronics, vol. 41, Springer Netherlands, 2013, Chapter 2, 89 pages.

Xu, Nuo, et al., "Physics-based Compact Modeling Framework for State-of-the-Art and Emerging STT-MRAM Technology," IEEE International Electron Devices Meeting, Dec. 2015, 4 pages.

(56) References Cited

OTHER PUBLICATIONS

Yang, Jinghua, et al., "Fast and Robust Differential Flipflops and their Extension to Multi-input Threshold Gates," International Symposium on Circuits and Systems, May 2015, IEEE, pp. 822-825.

Yang, Jinghua, et al., "Integration of Threshold Logic Gates with RRAM devices for Energy Efficient and Robust Operation," International Symposium on Nanoscale Architectures, Jul. 2014, IEEE, pp. 39-44.

Yu, Hao, et al., "Design Exploration of Emerging Nano-scale Non-volatile Memory," 1st edition, Springer-Verlag New York, 2014, 200 pages.

Zhang, Yue, et al., "Compact Modeling of Perpendicular-Anisotropy CoFeB/MgO Magnetic Tunnel Junctions," IEEE Transactions on Electron Devices, vol. 59, Issue 3, Mar. 2012, pp. 819-826.

Zhang, Yaojun, et al., "STT-RAM Cell Optimization Considering MTJ and CMOS Variations," IEEE Transactions on Magnetics, vol. 47, Issue 10, Oct. 2011, pp. 2962-2965.

Zhang, Yue, et al., "Compact Model of Subvolume MTJ and Its Design Application at Nanoscale Technology Nodes," IEEE Transactions on Electron Devices, vol. 62, Issue 6, Jun. 2015, 8 pages.

\* cited by examiner

US 10,795,809 B2

NON-VOLATILE LOGIC DEVICE FOR ENERGY-EFFICIENT LOGIC STATE RESTORATION

RELATED APPLICATIONS

This application claims the benefit of provisional patent application Ser. No. 62/615,666, filed Jan. 10, 2018, the disclosure of which is hereby incorporated herein by reference in its entirety.

FIELD OF THE DISCLOSURE

The present disclosure relates to electronic circuits, and in particular to non-volatile logic devices.

BACKGROUND

Microelectronic circuits that obtain their energy from ambient energy sources (AES) through scavenging or harvesting are increasing in popularity, particularly with the burgeoning field of the Internet of Things (IoT). Some of the more common AES include solar, piezoelectric, vibration, airflow, and thermoelectric.

The intermittent nature of the energy delivered by AES poses a challenge for microelectronic systems as they are generally architected for continuous operation. Conventional digital technology, including logic and memory (SRAM or DRAM), is volatile, such that information (e.g., a state of the computation and a state of memory) is lost when the power supply is disrupted. Due to the intermittent nature of AES, accurately predicting an impending power disruption and saving a current state is desired for most devices.

In non-volatile memory (NVM), the stored information is retained even when there is no power. With conventional NVM technology, the state of logic and memory has to be saved in an off-chip storage and restored when power is re-established. For example, a processing unit (e.g., a microcontroller) can be enhanced with a NVM array (NVMA), which is separate from the local (volatile) registers where the intermediate computation results of the processing unit are stored. Before the power failure, the data in all the registers is saved serially in the NVMA and later serially restored. This technique incurs high energy cost and a long backup time, and is typically not suitable for a system powered by AES.

SUMMARY

The present disclosure describes a non-volatile logic device for energy-efficient logic state restoration. In place of an off-chip non-volatile memory array (NVMA), each register in a processing unit (e.g., a microcontroller) can be a non-volatile flip-flop (NVFF), which operates similar to a regular flip-flop in a normal mode, but has the added capability of storing its state in a local non-volatile device before a power failure. The present disclosure describes circuit architecture for a NVFF which incorporates a volatile flip-flop and a non-volatile storage unit to achieve on-chip non-volatile storage. The non-volatile logic device further allows for the backup time to be determined on a per-chip basis, resulting in minimizing energy wastage and satisfying a given yield constraint.

In an exemplary aspect, the non-volatile logic device employs spin-transfer torque magnetic tunnel junctions (STT-MTJ) as a non-volatile device. A STT-MTJ device may operate with a critical current being delivered for some minimum duration in order to switch a state of the STT-MTJ. Other examples may use other compatible non-volatile logic devices, such as spin orbit torque magnetic tunnel junctions (SOT-MTJ).

An exemplary embodiment relates to a non-volatile logic device on a semiconductor die. The non-volatile logic device includes a volatile scan flip-flop and a non-volatile storage unit coupled to the volatile scan flip-flop. During a backup mode, the non-volatile storage unit stores a state of the volatile scan flip-flop. Upon loss of power to the non-volatile logic device, the non-volatile storage unit retains the stored state.

Another exemplary embodiment relates to a non-volatile flip-flop. The non-volatile flip-flop includes a volatile flip-flop and a non-volatile storage unit coupled to the volatile flip-flop. The non-volatile storage unit includes a data STT-MTJ configured to store a state of the volatile flip-flop during a backup mode and be inactive during a normal mode.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
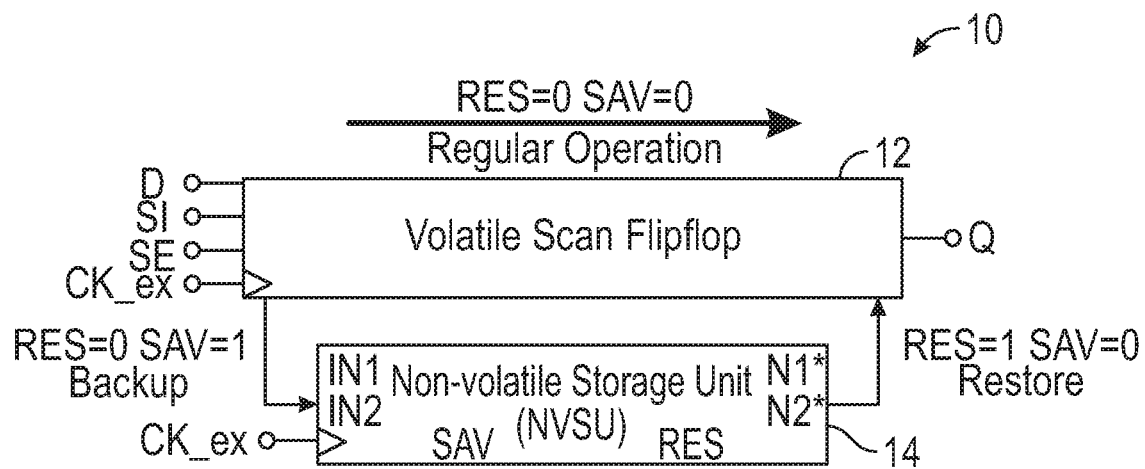
FIG. 1 is a schematic diagram of an exemplary non-volatile logic device including a volatile flip-flop and a non-volatile storage unit (NVSU).

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure describes a non-volatile logic device for energy-efficient logic state restoration. In place of an off-chip non-volatile memory array (NVMA), each register in a processing unit (e.g., a microcontroller) can be a non-volatile flip-flop (NVFF), which operates similar to a regular flip-flop in a normal mode, but has the added capability of storing its state in a local non-volatile device before a power failure. The present disclosure describes circuit architecture for a NVFF which incorporates a volatile flip-flop and a non-volatile storage unit to achieve on-chip non-volatile storage. The non-volatile logic device further allows for the backup time to be determined on a per-chip basis, resulting in minimizing energy wastage and satisfying a given yield constraint.

In an exemplary aspect, the non-volatile logic device employs spin-transfer torque magnetic tunnel junctions (STT-MTJ) as a non-volatile device. A STT-MTJ device may operate with a critical current being delivered for some minimum duration in order to switch a state of the STT-MTJ. Other examples may use other compatible non-volatile logic devices, such as spin orbit torque magnetic tunnel junctions (SOT-MTJ).

To assist in understanding aspects of the present disclosure, an overview of an exemplary non-volatile logic device is provided with reference to FIGS. 1-4. Exemplary implementations of the non-volatile logic device are described with reference to FIGS. 5A-6B. Because process variations may be present in production of non-volatile logic devices, consideration for these is described and addressed with reference to FIGS. 7-9. Testing and optimization of non-volatile logic devices given the process variations is described with reference to FIGS. 10 and 11. Experimental results of the non-volatile logic device under various implementations are described with reference to FIGS. 12, 13A, and 13B.

FIG. 1 is a schematic diagram of an exemplary non-volatile logic device 10 including a volatile flip-flop 12 and a non-volatile storage unit (NVSU) 14. In an exemplary aspect, under normal conditions the non-volatile logic device 10 operates as a traditional flip-flop, with the NVSU 14 inactive. However, when a power loss is predicted, the NVSU 14 becomes active and stores a state of the volatile flip-flop 12. When power is restored, the NVSU 14 restores the state of the volatile flip-flop 12 and operation resumes with the NVSU 14 inactive again. Thus, the non-volatile logic device 10 may facilitate near-instant backup and restoration.

The non-volatile logic device 10 may be deployed in a processing unit, such as a processor, a digital signal processor (DSP), an application specific integrated circuit (ASIC), a field programmable gate array (FPGA), or other programmable logic device. In such examples, the NVSU 14 permits a computation to be interrupted in midstream and resumed where it was suspended, with reduced hardware overhead for a control unit. In other examples, the non-volatile logic device 10 may be deployed in discrete gate or transistor logic, discrete hardware components, or any combination thereof.

As discussed further below with respect to FIGS. 7-10, process variations, including both within die variations and die-to-die variations, pose a major challenge in design of the non-volatile logic device 10, and may result in differences in the backup and restoration time of the NVSU 14. In this regard, the volatile flip-flop 12 may include a scan mechanism to facilitate determining actual backup/restore time on a per-chip basis. The actual backup/restore time is generally much smaller when using an optimally sized driver. Adjusting the backup time on a per-chip basis also improves energy consumption (e.g., reducing wasted energy) for backup when compared to a uniform or non-adjustable backup time.

Accordingly, the exemplary non-volatile logic device 10 is a non-volatile scan flip-flop (NVSFF) which receives a functional input signal D, a scan input signal SI, a scan enable signal SE (which switches between the functional input signal D and the scan input signal SI), and an external clock signal CK_ex, and outputs a flip-flop output signal Q. The non-volatile logic device 10 has five modes of operation: a normal mode, normal scan mode, backup mode, restore mode, and non-volatile test mode.

In the normal mode (regular operation) and normal scan mode, the non-volatile logic device 10 performs as an edge-triggered scan flip-flop. In these modes, a backup signal SAV and a restore signal RES are set to logic 0, which together disconnect the path between the NVSU 14 and the volatile flip-flop 12. During the backup mode, a current state of the volatile flip-flop 12 is stored in the NVSU 14. After the backup mode is completed, the system can be safely powered off without losing intermediate computing results. During the restore mode, the previously stored state is read out and presented on the flip-flop output signal Q of the volatile flip-flop 12. The non-volatile test mode is a combination of the normal scan mode, the backup mode, and the restore mode. This operation mode is mainly for performing a non-volatile device test and determining the backup time of the non-volatile logic device 10, as described further below with respect to FIGS. 11 and 12.

Figure 2A:
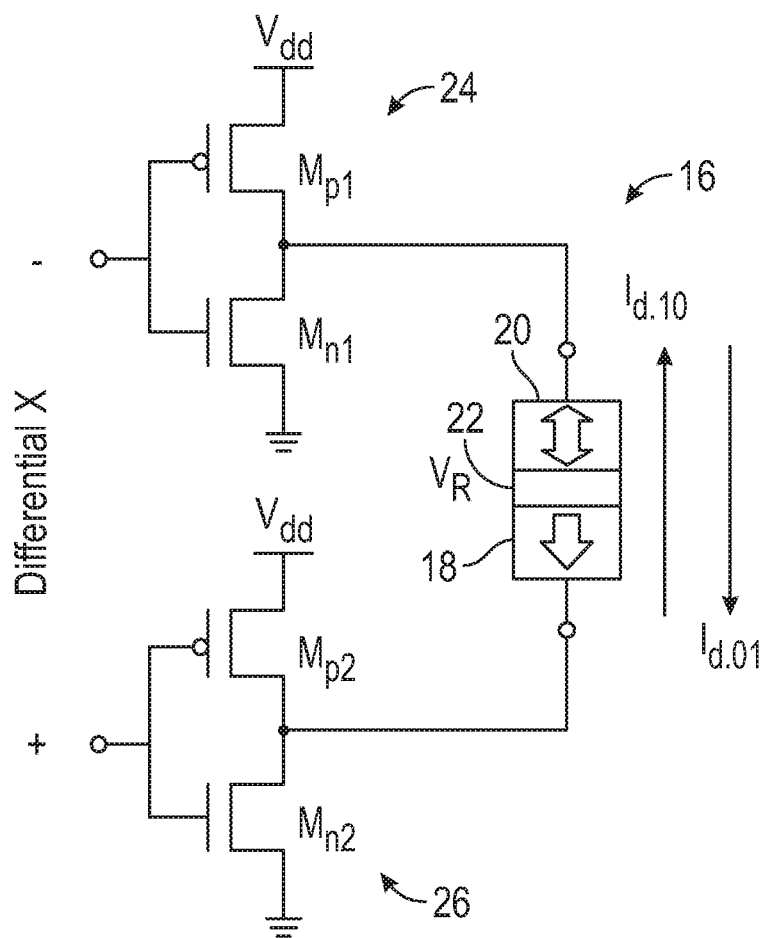
FIG. 2A is a schematic diagram of an exemplary non-volatile device for the NVSU of FIG. 1, a spin transfer torque magnetic tunnel junction (STT-MTJ) cell.

The NVSU 14 stores the state of the volatile flip-flop 12 using one or more non-volatile storage units (e.g., a transistor which maintains state without power). For example, FIG. 2A is a schematic diagram of an exemplary non-volatile device for the NVSU 14 of FIG. 1, a STT-MTJ cell 16. The STT-MTJ cell 16 includes two ferromagnetic layers 18, 20 with one oxide insulation layer 22 (such as magnesium oxide (MgO)) in between. A first ferromagnetic layer has a fixed magnetization and is referred to as a reference layer 18. A second ferromagnetic layer has a magnetic orientation which can be freely switched and is referred to as a free layer 20.

Figure 2B:
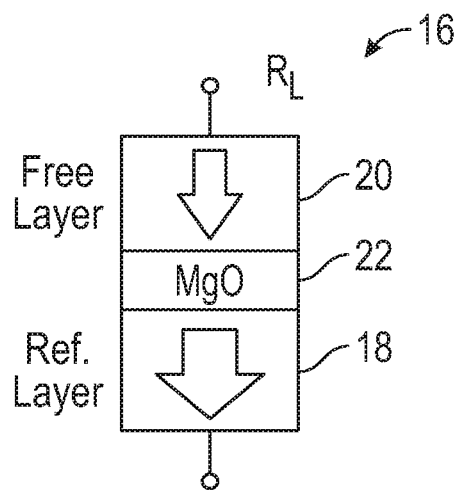
FIG. 2B is a schematic diagram of the STT-MTJ cell of FIG. 2B in a low resistance state.
Figure 2C:
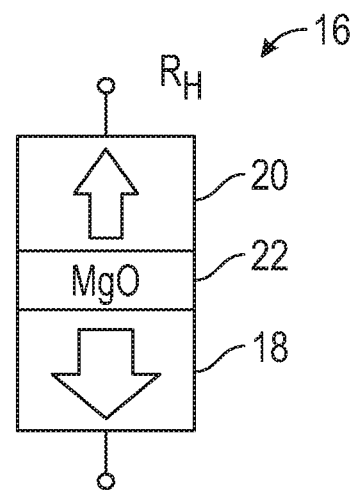
FIG. 2C is a schematic diagram of the STT-MTJ cell of FIG. 2B in a high resistance state.

According to the relative orientation of the reference layer 18 and the free layer 20, the STT-MTJ cell 16 has two different resistance states. When the spin orientations in the reference layer 18 and the free layer 20 are parallel, the STT-MTJ cell 16 has low resistance, denoted as $R_L$. FIG. 2B is a schematic diagram of the STT-MTJ cell 16 of FIG. 2B in a low resistance state $R_L$. When the spin orientations in the reference layer 18 and the free layer 20 are anti-parallel, the STT-MTJ cell 16 has high resistance, denoted as $R_H$. FIG. 2C is a schematic diagram of the STT-MTJ cell 16 of FIG. 2B in a high resistance state $R_H$. Accordingly, the STT-MTJ cell 16 stores binary data using two non-volatile resistance states, with $R_H$ representing a logic value 1, and $R_L$ representing logic value 0 (or vice versa).

The resistance state of the STT-MTJ cell 16 is set by a differential potential X coupled to a first driver circuit 24 and a second driver circuit 26. The first driver circuit 24 includes a first p-type field-effect transistor (pFET) $M_{p1}$ and a first n-type field-effect transistor (nFET) $M_{n1}$, and the second driver circuit 26 includes a second pFET $M_{p2}$ and a second nFET $M_{n2}$. Thus, when the differential potential X=0 (e.g., a lower potential is present at the first driver circuit 24 than the second driver circuit 26), the first pFET $M_{p1}$ and the second nFET $M_{n2}$ close and current $I_{d,10}$ flows through the STT-MTJ cell 16. This sets the resistance state to $R_L$. Transversely, when the differential potential X=1 (e.g., a higher potential is present at the first driver circuit 24 than the second driver circuit 26), the first nFET $M_{n1}$ and the second pFET $M_{p2}$ close and current $I_{d,01}$ flows through the STT-MTJ cell 16. This sets the resistance state to $R_H$.

Figure 3A:
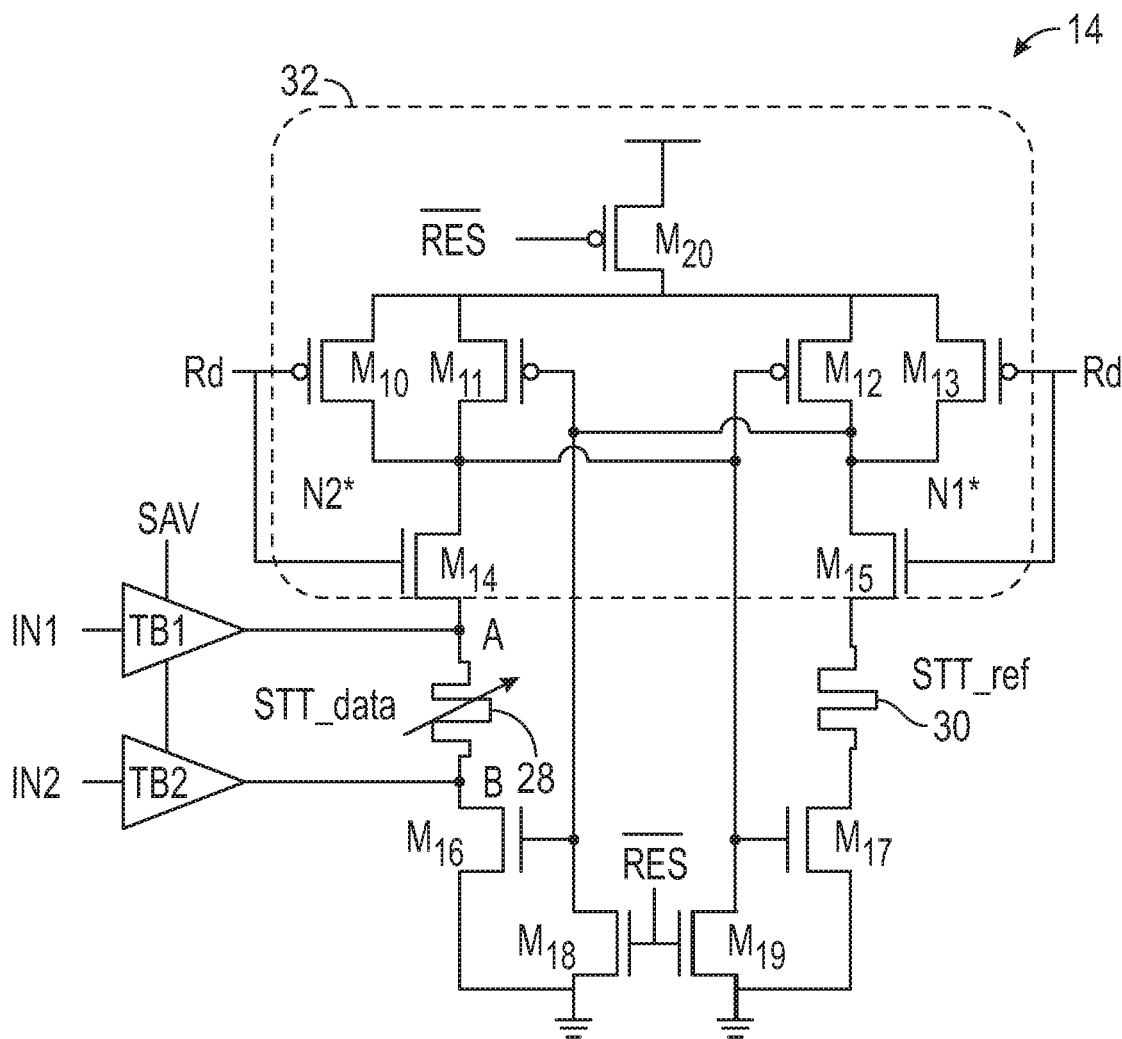
FIG. 3A is a schematic diagram of an exemplary NVSU of the non-volatile logic device of FIG. 1.

FIG. 3A is a schematic diagram of an exemplary NVSU 14 of the non-volatile logic device 10 of FIG. 1. The NVSU 14 includes a data transistor 28 and a reference transistor 30, each of which may include the STT-MTJ cell 16 of FIGS. 2A-2C. It should be understood, however, that use of the STT-MTJ cell 16 is exemplary in nature, and other examples may use different compatible non-volatile logic devices for the data transistor 28 and the reference transistor 30, such as SOT-MTJ.

The NVSU 14 is configured to receive two differential input signals IN1 and IN2 (e.g., representing a state of the volatile flip-flop 12 of FIG. 1). The data transistor 28 stores the state of the volatile flip-flop 12 during the backup mode, and the NVSU 14 outputs two differential output signals (e.g., restored output signals N1* and N2*) during the restore mode. The reference transistor 30 serves as a reference against the data transistor 28 during the restore mode. The operational modes of the NVSU 14 are further described as follows.

Normal Mode and Normal Scan Mode:

The NVSU 14 is inactive during the normal mode, and is turned off to save power (e.g., the backup signal SAV and the restore signal RES are both set to logic 0). Transistors which couple to the differential input signals IN1 and IN2 and restored output signals N1* and N2* (e.g., transistors $M_{10}$, $M_{11}$, $M_{12}$, $M_{13}$, $M_{B1}$, $M_{B2}$) can be sized smaller to reduce parasitic effects on the signal path through the volatile flip-flop 12.

Backup Mode:

The NVSU 14 is set to the backup mode by setting restore signal RES=0 and backup signal SAV=1. The NVSU 14 includes a state sense amplifier 32 which is inactive during the backup mode. When the NVSU 14 enters the backup mode, current flows through write buffers TB1 and TB2 (which may be tri-state buffers) to set the state of the data transistor 28. Thus, the current direction through the data transistor 28 is determined by the differential input signals IN1 and IN2.

Figure 3B:
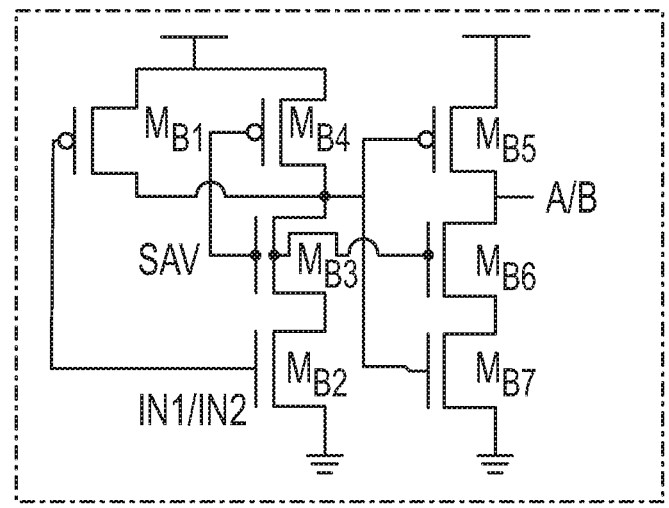
FIG. 3B is a schematic diagram of a write buffer of the NVSU of FIG. 3A.

FIG. 3B is a schematic diagram of one of the write buffers TB1, TB2 of the NVSU 14 of FIG. 3A. In an exemplary aspect, the write buffers TB1 and TB2 replace the driver circuits 24, 26 of FIG. 2A. Each write buffer TB1, TB2 includes one pFET $M_{B5}$ and two nFETs $M_{B6}$ and $M_{B7}$ in a stack. As compared with the driver circuits 24, 26, the additional nFET $M_{B6}$ is controlled by the backup signal SAV to eliminate a false path to the data transistor 28 during the restore mode (when the backup signal SAV=0).

With continued reference to FIGS. 1-3B, in some examples the backup signal SAV is independent of a clock signal, and as long as the backup signal SAV=1 and the differential input signals IN1 and IN2 are differential, the write buffers TB1 and TB2 will provide the necessary current to store the state of the volatile flip-flop 12 of FIG. 1. Generally, additional circuitry can predict an impending power system failure and initiates the backup by setting the backup signal SAV=1.

Restore Mode:

When device power is re-established, the state of the volatile flip-flop 12 of FIG. 1 can be restored by setting the backup signal SAV=0 and the restore signal RES=1. During the restore mode, the write buffers TB1 and TB2 are disabled. When a read signal Rd=0, a first restored output signal N1*=1 and a second restored output signal N2*=1. By switching read signal Rd from 0→1, transistors $M_{14}$ and $M_{15}$ become active, creating discharge paths to ground for both restored output signals N1* and N2*. The state sense amplifier 32 senses a difference in conductance between the discharging path through the data transistor 28 and the discharging path through the reference transistor 30. The state sense amplifier 32 sets the restored output signals N1* and N2* accordingly, which drive the flip-flop output signal Q.

For example, the backup mode may have previously stored a logic 0 state of the volatile flip-flop 12, with the state of the data transistor 28 set to $R_L$. $R_L$ may be lower than a resistance of the reference transistor 30, such that the state sense amplifier 32 senses the conductance difference between the two discharging paths and sets N2*=0 and N1*=1. This, in turn, sets the flip-flop output signal Q to logic 0, restoring the stored state.

A read disturb can occur when the stored state in the data transistor 28 is flipped on a read operation. The probability of a read disturb in the NVSU 14 can be reduced by using smaller transistors or lowering the power supply voltage for the state sense amplifier 32, at the cost of a longer restoration time. Unlike non-volatile memory implementations in which the stored data would be read more than once, in the non-volatile logic device 10 with backup and restore, the stored data would only be restored once. When the next power interruption occurs, new data would be backed up. Therefore, the read disturb may not be of particular concern in some embodiments.

Non-Volatile Test Mode:

This mode is applied to test the functionality of the backup and restore modes, as well as to determine an optimal backup time for the NVSU 14. Unlike the other operation modes, this involves a sequence of operations, as illustrated in FIG. 4.

Figure 4:
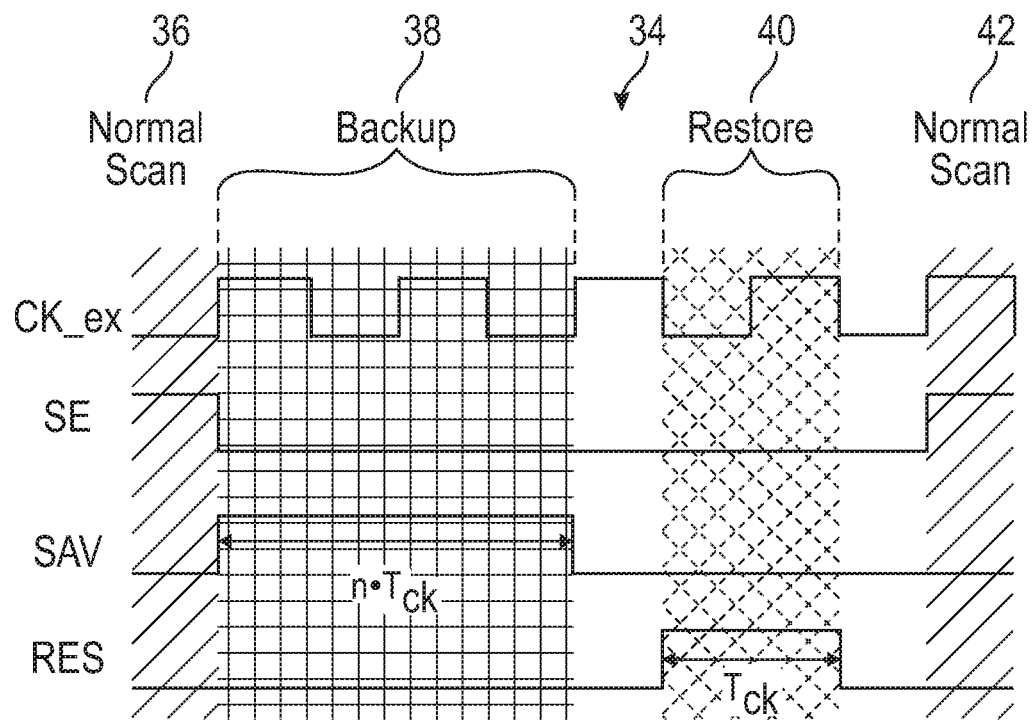
FIG. 4 illustrates an exemplary control signal sequence during a non-volatile test mode of the non-volatile logic device of FIG. 1.

FIG. 4 illustrates an exemplary control signal sequence 34 during the non-volatile test mode of the non-volatile logic device of FIG. 1. With reference to FIGS. 1-4, the non-volatile test mode starts with the non-volatile logic device 10 in a normal scan mode 36 (the scan enable signal SE=1, the backup signal SAV=0, and the restore signal RES=0) that scans in the test data, resulting in the data appearing at the flip-flop output signal Q. After the data has been scanned in, the non-volatile logic device 10 is switched to a backup mode 38 and then a restore mode 40. After the backup and restore operations, the previous test data will be present at the flip-flop output signal Q, if both steps completed successfully. Then the output data is scanned out for verification by switching to a normal scan mode 42. The backup time is the duration when the backup signal SAV=1.

In further detail, the restore signal RES is synchronized with the falling edge of the external clock signal CK_ex, and therefore can be generated by a negative edge triggered flip-flop. The read signal Rd is generated by both the restore signal RES and the external clock signal CK_ex, which feeds into the state sense amplifier 32. The backup signal SAV controls the write buffers TB1 and TB2. When the differential input signals IN1 and IN2 are stable, the duration of the backup signal SAV determines a backup time $\tau$. Although the backup signal SAV can be synchronous or asynchronous, a synchronous signal may be used in some embodiments as it can easily be generated by a counter followed by a flip-flop, and the total backup time would simply be $[\tau/T] \times T$, where T is the clock period. An asynchronous backup signal SAV can be generated by a separate pulse generation circuit, where $\tau$ is controlled by the pulse width. In an energy-area-constrained digital system, a synchronous backup signal SAV may be preferred because control circuitry would be smaller and consume less power than an on-chip pulse generator. One disadvantage of using a synchronous backup signal SAV is that the granularity with which $\tau$ can be adjusted is limited to one clock period. Therefore, if the clock period is large, an asynchronous backup signal SAV may instead result in lower energy expenditure.

During the backup mode 38, the differential input signals IN1 and IN2 should be differential and stable. No current would flow through the data transistor 28 if the differential input signal IN1=the differential input signal IN2. If both signals flip, the current direction would change. During the restore mode 40, the restored output signals N1* and N2* will become differential after the state sense amplifier 32 evaluates (e.g., when the external clock signal CK_ex=1 and the read signal Rd=1). When the external clock signal CK_ex=0 and the read signal Rd=0, both restored output signals N1* and N2* are reset to 1. Thus, a latch is used to maintain the evaluation results on the non-volatile logic device 10 flip-flop output signal Q when the external clock signal CK_ex is low.

The NVSU 14 takes a pair of differential input signals IN1 and IN2 during the backup mode 38, and produces a pair of differential output signals (restored output signals N1* and N2*) during the restore mode 40. Therefore, using a differential or sense-amp based flip-flop for the volatile flip-flop 12 may have a simple interface with the NVSU 14.

Figure 5A:
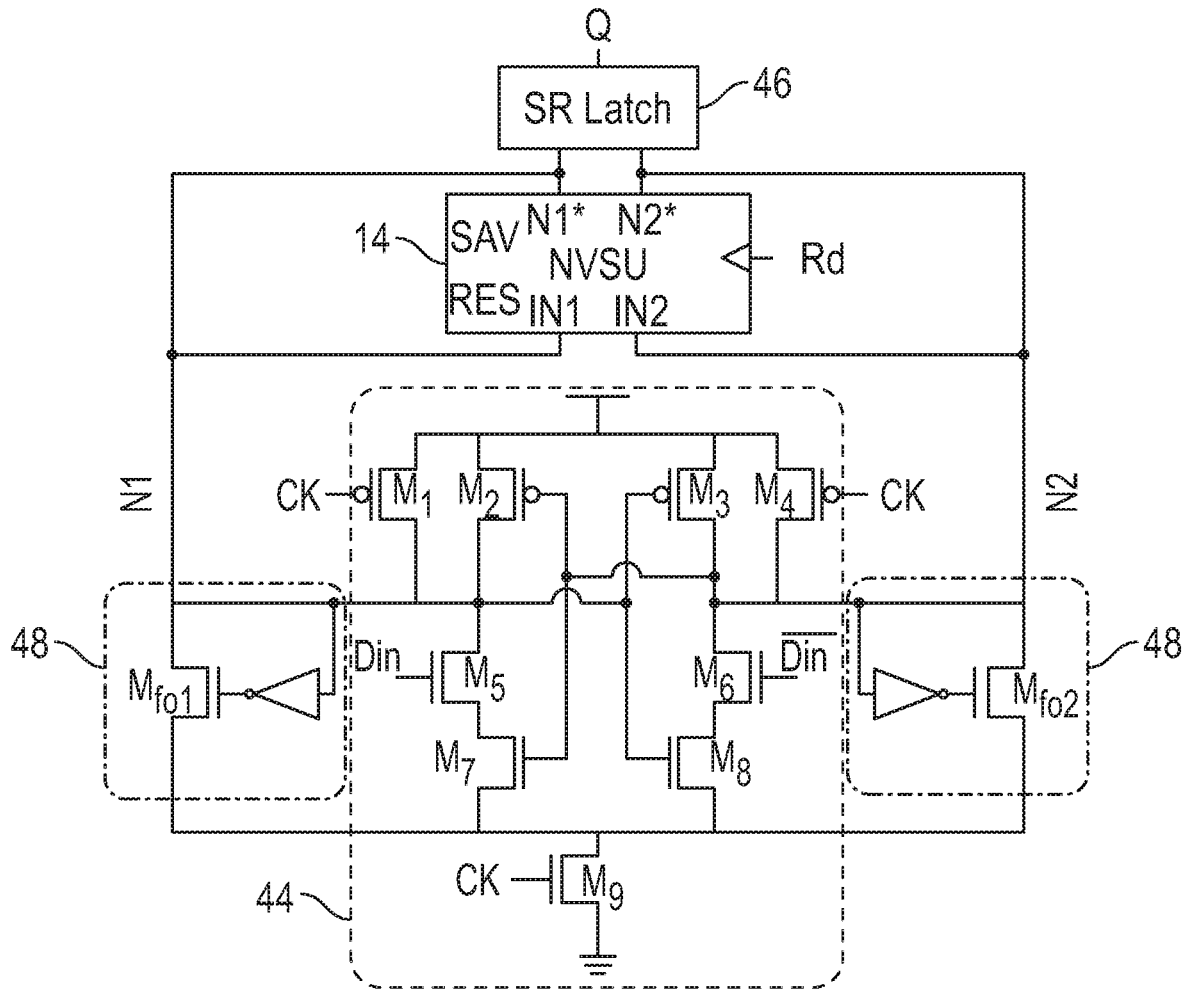
FIG. 5A is a schematic diagram of the non-volatile logic device of FIG. 1, implemented with an exemplary differential flip-flop as the volatile flip-flop.

In this regard, FIG. 5A is a schematic diagram of the non-volatile logic device 10 of FIG. 1, implemented with an exemplary differential flip-flop 44 as the volatile flip-flop 12. The exemplary non-volatile logic device 10 of FIG. 5A may be referred to as a non-volatile scan differential flip-flop (NVSFF-DM). The NVSFF-DM includes a differential flip-flop 44 (e.g., a differential sense amplifier) with volatile output signals N1 and N2 connected to an SR-latch 46 and the NVSU 14. The inputs to the SR-latch 46 can be switched from either the differential flip-flop 44 or the NVSU 14 outputs. In some examples, a tri-state buffer (not shown) may connect the SR-latch 46 to the volatile output signals N1 and N2 and the NVSU 14.

In the normal mode, when an internal clock signal CK=0, the volatile output signal N1=1 and the volatile output signal N2=1. When the internal clock signal CK moves from 0→1, (N1, N2)=(0, 1) or (N1, N2)=(1, 0), depending on an input D. (N1, N2) set the output of the SR-latch 46 accordingly. The differential flip-flop 44 of FIG. 5A includes two feedback loops 48 to eliminate potential floating nodes that may be present in conventional differential flip-flops. The volatile output signals N1, N2 become differential and stable after evaluation is completed.

Figure 5B:
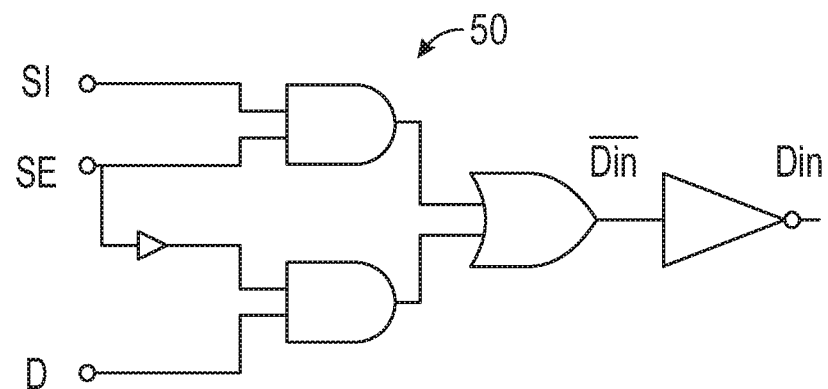
FIGS. 5B-5D are schematic diagrams of exemplary input circuits for the non-volatile logic device of FIG. 5A.
Figure 5C:
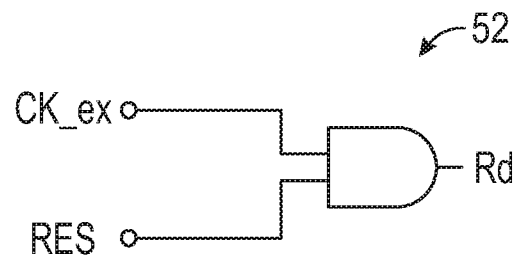
Figure 5D:
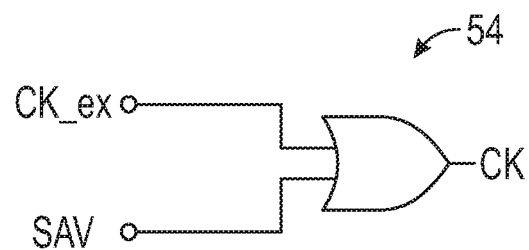

FIGS. 5B-5D are schematic diagrams of exemplary input circuits 50, 52, 54 for the non-volatile logic device 10 of FIG. 5A. As depicted in FIG. 5B, a first input circuit 50 generates a flip-flop input signal Din and its inverse $\overline{Din}$ by gating the functional input signal D, the scan enable signal SE, and the scan input signal SI such that the scan enable signal SE switches the flip-flop input signal Din between the functional input signal D and the scan input signal SI.

A second input circuit 52 generates the read signal Rd by gating the restore signal RES with the external clock signal CK_ex. The restore signal RES ensures that the read signal Rd follows the external clock signal CK_ex only during the restore mode, which ensures that the state sense amplifier 32 will operate and consume power only during the restore mode. A third input circuit 54 generates the internal clock signal CK by gating the backup signal SAV with the external clock signal CK_ex. The backup signal SAV ensures that the internal clock signal CK remains at 1 during the backup mode, which ensures that (N1, N2) change from (1, 1) to (0, 1) or (1, 0) only once. The SR-latch 46 latches the output either from the differential flip-flop 44 or the NVSU 14 as appropriate.

Figure 6A:
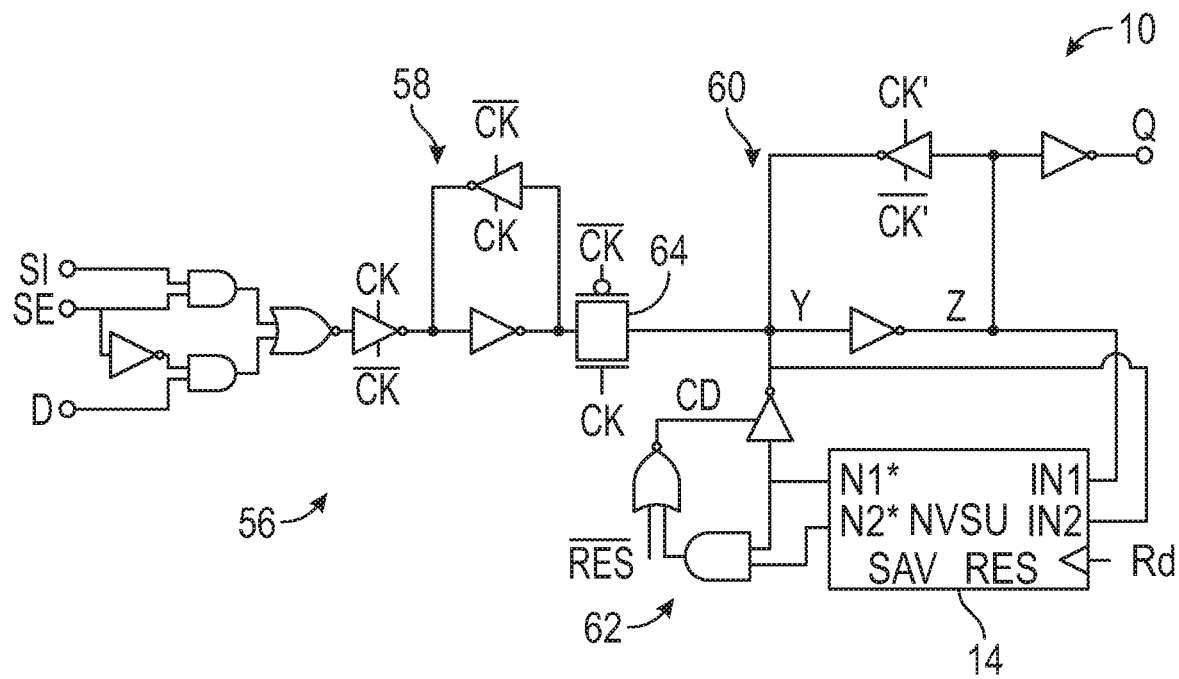
FIG. 6A is a schematic diagram of the non-volatile logic device of FIG. 1, implemented with an exemplary master-slave flip-flop as the volatile flip-flop.

FIG. 6A is a schematic diagram of the non-volatile logic device 10 of FIG. 1, implemented with an exemplary master-slave flip-flop 56 as the volatile flip-flop 12. The NVSU 14 can also be combined with the master-slave flip-flop 56 in a modified manner from that depicted in FIG. 5A, and may be referred to as a non-volatile scan master-slave flip-flop (NVSFF-MS). The scan mechanism may be the same as in a conventional D-flip-flop. However, the NVSU 14 needs to be properly interfaced with a master latch 58 and a slave latch 60.

In this regard, the NVSU 14 receives slave output signals at nodes Y and Z from the slave latch 60 during the backup mode and sends its output back to node Y during the restore mode. To prevent the NVSU 14 from interfering with the slave latch 60 during the normal mode and backup mode, a master-slave buffer 62 is used to buffer the output of the NVSU 14. This master-slave buffer 62 (e.g., a tri-state buffer) should be turned on only when the NVSU 14 is in the restore mode and its outputs are ready. Since the outputs of the NVSU 14 would become differential only when they are ready, a completion detection signal CD is derived from the restored output signals N1* and N2* to drive the master-slave buffer 62. Unlike the NVSFF-DM of FIG. 5A, the slave latch 60 and a transmission gate 64 (between the master and slave latches 58, 60) in the non-volatile logic device 10 (NVSFF-MS) of FIG. 6A are driven by different derived clocks derived from the external clock signal CK_ex. During the restore mode, the transmission gate 64 should be turned off to block the signal from the master latch 58. After the state is restored into the slave latch 60, the slave latch 60 should be able to latch the data when the external clock signal CK_ex goes to 0.

Figure 6B:
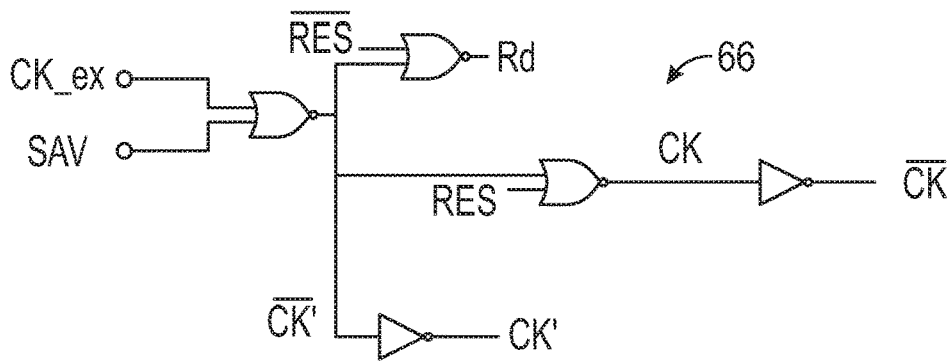
FIG. 6B is a schematic diagram of an exemplary input circuit for the non-volatile logic device of FIG. 6A.

FIG. 6B is a schematic diagram of an exemplary input circuit 66 for the non-volatile logic device 10 of FIG. 6A. In the normal mode and the normal scan mode (e.g., when both the backup signal SAV and restore signal RES are 0), the NVSFF-MS operates the same as a normal scan flip-flop. However, internal clock signals CK, CK', $\overline{CK}$ and $\overline{CK'}$ follow the external clock signal CK_ex under different conditions. A first internal clock signal CK (and its inverse $\overline{CK}$) follows the external clock signal CK_ex when both the backup signal SAV=0 and the restore signal RES=0, and a second internal clock signal CK' (and its inverse $\overline{CK'}$) follows the external clock signal CK_ex when the backup signal SAV=0.

The nodes Y and Z are fed into the NVSU 14 as the differential input signals IN1 and IN2. In the backup mode, the backup signal SAV=1 and the restore signal RES=0. Then the first internal clock signal CK=the second internal clock signal CK'=1 and their inverses $\overline{CK}=\overline{CK'}$=0. This disconnects the master latch 58 from its inputs and from the slave latch 60, so that the value of the master latch 58 can be saved in the NVSU 14. The restore signal RES=0 and the completion detection signal CD=0, blocking the first restored output signal N1* to node Y. This ensures that the nodes Y and Z are kept differential and stable during the entire backup mode.

During the restore mode, the restore signal RES=1, the first internal clock signal CK=0 and its inverse $\overline{CK}$=1. Thus, the transmission gate 64 between the master latch 58 and the slave latch 60 is blocked. In the meantime, the read signal Rd, the second internal clock signal CK' and its inverse $\overline{CK'}$ follow the external clock signal CK_ex. When the external clock signal CK_ex=0, the first restored output signal N1*=the second restored output signal N2*=1, and the completion detection signal CD=0. The slave latch 60 latches its previous state. When the external clock signal CK_ex changes from 0→1, the state sense amplifier 32 in the NVSU 14 sets the restored output signals N1* and N2* into opposite values. These two differential signals set the completion detection signal CD=1, which enables the master-slave buffer 62 between the NVSU 14 and the slave latch 60. The value of the restored output signal N1* is therefore sent to the slave latch 60 to set the flip-flop output signal Q.

With reference to FIGS. 1-6B, process variations, including both within die variations and die-to-die variations, pose a major challenge in the design of the non-volatile logic device 10. In particular, variations in the data transistor 28 (e.g., an STT-MTJ cell 16 or an SOT-MTJ cell), along with variations in the circuitry which drives the data transistor 28 (e.g., the transistors $M_{B1}$, $M_{B2}$, $M_{B3}$, $M_{B4}$, $M_{B5}$ $M_{B6}$, and $M_{B7}$ of the write buffers TB1, TB2) may result in statistical variations in the actual current being delivered for changing the resistance state of the data transistor 28. It should be understood that while the following discussion is made with particular reference to FIGS. 2A-2C, the STT-MTJ cell 16, and the driver circuits 24, 26, it also applies to FIGS. 3A and 3B, the data transistor 28, and the write buffers TB1, TB2, respectively.

Designing embodiments with such variations in mind may require quantifying the ensuing trade-offs between reliability (probability of a successful backup), area of the driver circuits, backup and restoration time, and power consumption. Accordingly, embodiments of the present disclosure further improve design of the non-volatile logic device 10 by considering process variations and examination of such trade-offs.

In this regard, returning to FIGS. 2A-2C, the STT-MTJ cell 16 stores binary data using two non-volatile resistance states, $R_H$ and $R_L$ as described above. Tunnel magnetoresistance (TMR) is an important parameter that measures the relative separation between the two resistance values. It is defined as:

$$TMR = \frac{R_H - R_L}{R_L}.$$

The TMR values can range from 50% to 200%, and in some cases can be as high as 600%. In the following analysis, $R_L$ and $R_H$ are assumed to be constants, independent of the voltage across the device, though this may not always be the case. Equivalently, these resistances can be assumed to be their maximum values at $V_R$=0. Furthermore, without loss of generality, it is assumed that the change in resistance between $R_L$ and $R_H$ is abrupt (though this may not always be the case), and therefore, the switching time r of the STT-MTJ cell 16 (and similarly the data transistor 28) can be defined as the time at which the abrupt change takes place.

Because of thermal fluctuations, the switching of the STT-MTJ cell 16 is a stochastic process. Given switching current $I_d$, a stochastic switching time $\tau_s$ varies from cycle to cycle. Deterministic $\tau$ is defined to be the largest value for $\tau_s$ for a given current $I_d$. Thus, a deterministic switching can be assumed when $I_d$ is greater than a critical current $I_c$.

Applying the differential potential X=1 across the first driver circuit 24 and the second driver circuit 26 (e.g., with the higher potential at the second driver circuit 26), the first driver circuit 24 and the second driver circuit 26 will cause the current $I_{d,01}$ to flow through the first pFET $M_{p1}$, the STT-MTJ cell 16, and the second nFET $M_{n2}$. This must exceed a critical current $I_{c,01}$ for a duration of $\tau_{01}$ in order for the STT-MTJ cell 16 to switch from $R_L$ to $R_H$. Similarly, the differential potential X=0 will cause the current $I_{d,10}$ to flow in the reverse direction through the second pFET $M_{p2}$, the STT-MTJ cell 16, and the first nFET $M_{n1}$. This current must exceed a critical current $I_{c,10}$ for a minimum duration of $\tau_{10}$, in order for the device to switch from $R_H$ to $R_L$. Thus the four critical parameters associated with an MTJ are $R_L$, $R_H$, $I_c$ and $\tau$.

The following equations are simplified expressions for $R_L$ and $R_H$ and the switching time $\tau$ of an STT-MTJ cell 16:

$$R_L = \alpha t_{ox} e^{\beta t_{ox}} \quad \text{Equation 1}$$

$$R_H = (1 = TMR) R_L \quad \text{Equation 2}$$

$$\tau = \kappa_j \frac{1}{|I_d - I_c|} \quad \text{Equation 3}$$

In an exemplary aspect, $R_L$ and $R_H$ are comparable to the on-channel resistances of the transistors in the first driver circuit 24 and the second driver circuit 26 (in the NVSU 14, the write buffers TB1 and TB2 of FIGS. 3A and 3B). Therefore, the voltage drop across the STT-MTJ cell 16 during switching, combined with a fixed power supply $V_{dd}$, limits the maximum current that the driver circuits 24, 26 can deliver. The driver current (e.g., $I_{d,01}$, $I_{d,10}$) depends on the transistor dimensions together with $R_L$ and $R_H$, which are in turn related to $t_{ox}$ of the STT-MTJ cell 16 (Equations 1 and 2). Local and global process variations in transistors and STT-MTJs (and other examples of the data transistor 28 and reference transistor 30, such as SOT-MTJs) make the driver current a statistically varying quantity among different devices on the same semiconductor die and among the same devices on different semiconductor dice. However, before considering process variations, the factors that affect the transistor sizes in the driver, and how those sizes might be determined are examined.

The driver currents $I_{d,01}$ and $I_{d,10}$ are functions of $R_L$, $R_H$, a transistor width $W_{n2}$ of the second nFET $M_{n2}$, and a transistor width $W_{n1}$ of the first nFET $M_{n1}$, where $R_L$ and $R_H$ are determined by $t_{ox}$ (see Equation 1). Writing a logic 1 in the STT-MTJ cell 16 will require $I_{d,01}(t_{ox}, W_{n2}) > I_{c,01}$, and the corresponding switching time $\tau_{01}$ will be inversely proportional to the excess current (Equation 3). Writing a logic 0 in the STT-MTJ cell 16 will require $I_{d,10}(t_{ox}, W_{n1}) > I_{c,10}$, and the corresponding switching time $\tau_{10}$ will be inversely proportional to the excess current (Equation 3).

Figure 7A:
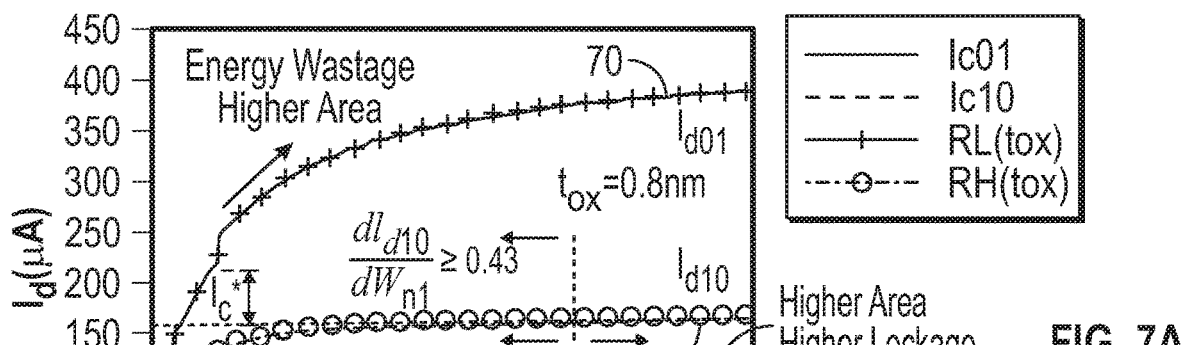
FIGS. 7A-7F illustrate possible cases of driver current versus transistor width for the STT-MTJ cell of FIG. 2A.

FIGS. 7A-7F illustrate possible cases of driver current versus transistor width for the STT-MTJ cell 16 of FIG. 2A. In this regard, let $$\gamma = \frac{W_{p1}}{W_{n2}} = \frac{W_{p2}}{W_{n1}}$$

denote the ratio of the width of the first pFET $M_{p1}$ to the width of the second nFET $M_{n2}$ (and the width of the second pFET $M_{p2}$ to the first nFET $M_{n1}$), and assume that $\gamma$ is fixed. FIG. 7A shows a graphical representation of the driver currents $I_{d,01}$ and $I_{d,10}$ as a function of the width of the corresponding nFETs, $W_{n2}$ and $W_{n1}$, respectively, for a specific value of $t_{ox}$.

As shown in FIG. 7A, it is seen that any pair of values for the transistor widths $W_{n2}$ and $W_{n1}$ are feasible as long as the corresponding $I_{d,01}(W_{n2}) > I_{c,01}$ and $I_{d,10}(W_{n1}) > I_{c,10}$. It may be desirable to choose values that minimize the average or total energy required to store a 0 and 1. The total energy can be expressed as $E_{total} = V_{dd}(\tau_{01} I_{d,01}(W_{n2}) + \tau_{10} I_{d,10}(W_{n1}))$. Now a single backup time can be used for storing a 0 or a 1. Hence that backup time would be $\tau = \max\{\tau_{01}, \tau_{10}\}$. In this case, the total energy would be written as:

$$E_{total} = V_{dd}[\tau_{01} I_{d,01}(W_{n2}) + (\tau - \tau_{01}) I^*_{d,01}(W_{n2}) + \tau_{10} I_{d,10}(W_{n1}) + (\tau - \tau_{10}) I^*_{d,10}(W_{n1})] \quad \text{Equation 4}$$

Currents $I^*_{d,01}(W_{n2})$ and $I^*_{d,10}(W_{n1})$ are the currents after the state transitions have completed. They are different from $I_{d,01}(W_{n2})$ and $I_{d,10}(W_{n1})$ because of the change in the STT-MTJ cell 16 resistances. The total energy $E_{total}$ is at least $V_{dd}(\tau_{01} I_{d,01}(W_{n2}) + \tau_{10} I_{d,10}(W_{n1}))$. Hence the minimum of the average or total energy with a single backup time would require that $\tau = \tau_{01} = \tau_{10}$. Then, using Equation 3, $I_{d,01}(W_{n2}) - I_{c,01} = I_{d,10}(W_{n1}) - I_{c,10}$, or equivalently, $I_{d,01}(W_{n2}) - I_{d,10}(W_{n1}) = I_{c,01} - I_{c,10} = I^*_c$; where $I^*_c$ is independent of $t_{ox}$. Therefore the basic constraint that needs to be satisfied when determining the driver size is:

$$I_{d,01}(W_{n2}) = I_{d,10}(W_{n1}) + I^*_c \quad \text{Equation 5}$$

If Equation 5 is satisfied, then the total energy is $E_{total} = V_{dd} \tau (2 I_{d,10}(W_{n1}) + I^*_c)(W_{n2})$. Now $$\tau = \tau_{10} = \frac{\kappa_j}{(I_{d,10}(W_{n1}) - I_{c,10})},$$

and $E_{total}$ can be written as:

$$E_{total} = V_{dd} \kappa_j \left( \frac{2 I_{d,10}(W_{n1}) + I^*_c}{I_{d,10}(W_{n1}) - I_{c,10}} \right) \quad \text{Equation 6}$$

Equation 6 shows that with equal switching times for storing a 0 and 1, minimizing the total energy is equivalent to maximizing $I_{d,10}(W_{n1})$. This fact can be used to determine $W_{n1}$ and $I_{d,10}(W_{n1})$. $W_{n2}$ is determined by solving Equation 5.

FIG. 7A shows plots of $I_{d,10}(W_{n1})$ 68 and $I_{d,01}(W_{n2})$ 70 as a function of driver transistor width which are enumerated in discrete increments. $W_{min}$ is the minimum possible width. $W_{n1,ub}$ and $W_{n2,ub}$ denote widths at which the currents $I_{d,10}$ and $I_{d,01}$ have saturated, e.g., for some small $\varepsilon > 0$, $E > 0$, $$W_{n1,ub} = \min\left\{W \left| \frac{dI_{10}}{dW} \le \varepsilon \right.\right\} \text{ and } W_{n2,ub} = \min\left\{W \left| \frac{dI_{01}}{dW} \le \varepsilon \right.\right\}.$$

Choosing a value larger than $W_{n1,ub}$ or $W_{n2,ub}$ will not increase the current appreciably, but increases area. As $E_{total}$ decreases with $I_d$, and $I_d$ is monotonic with respect to W, the width $W_{n1}$ that maximizes $I_d$ can be determined by examining the boundary conditions.

Figure 7B:
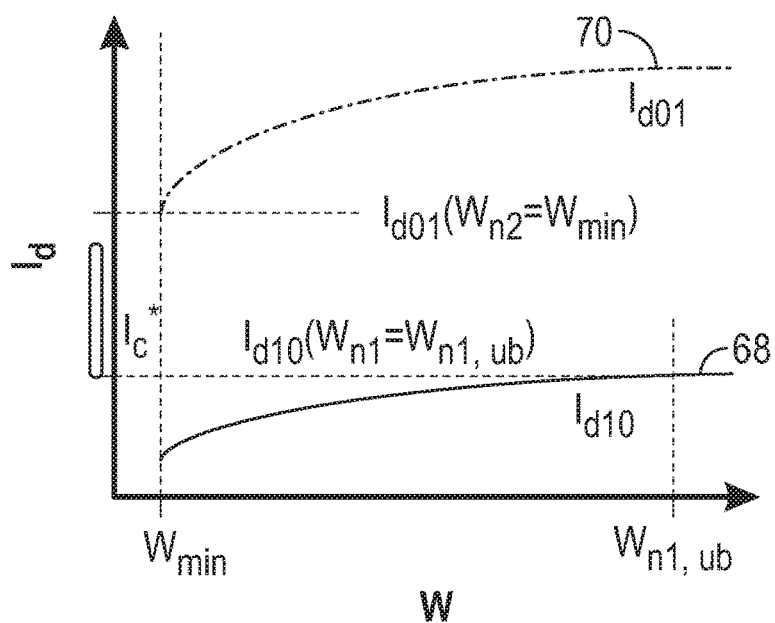

FIG. 7B shows a first case: $I_{d,01}(W_{n2}=W_{min})>I_{2,10}(W_{m1}=W_{n1,ub})+I^*_c$. This corresponds to a situation where $R_L \ll R_H$ (the low and high resistances are widely separated), and even choosing $W_{n1}=W_{n1,ub}$, there is no corresponding value of $W_{n2}$ for which $I_{d,10}(W_{n1,ub})+I^*_c=I_{d,01}(W_{n2})$. Therefore, equal backup time is not possible and Equation 5 cannot be satisfied. Therefore, the only choice is $W_{n2}=W_{min}$. Choosing a larger value for $W_{n2}$ simply makes writing a logic value 1 even faster, while the actual backup time is determined by the time required to write a logic value 0. Hence choosing a larger value of $W_{n2}$ wastes energy and area. Choosing a smaller value for $W_{n1}$ simply makes writing a logic value 0 even slower.

Note that with $R_L \ll R_H$, the process of reading is more robust, at the expense of increased energy for writing. This is opposite to the general conclusion on non-volatile memory design that wide $R_L$ and $R_H$ separation is always desired. In an AES powered non-volatile logic design, devices with widely separated resistance states like a resistive random access memory (RRAM) cell require more energy for writing data than MTJs, while providing greater robustness when reading data.

Figure 7C:
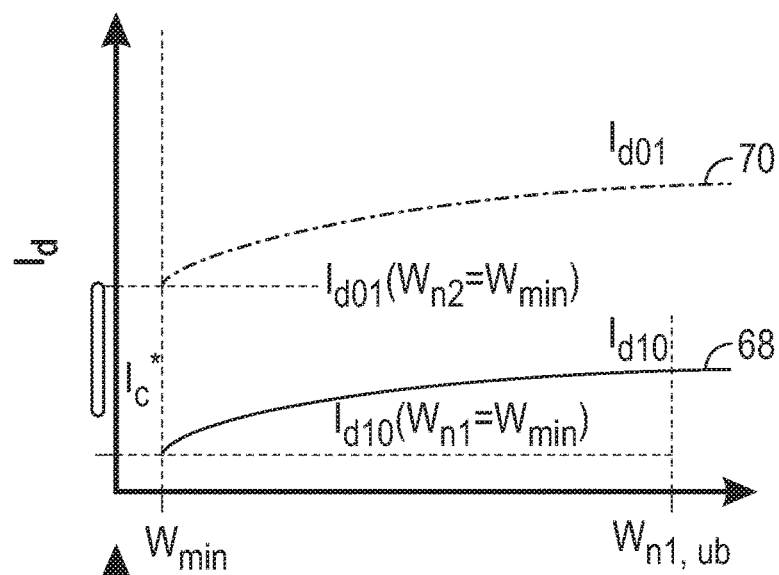

FIG. 7C shows a second case: $I_{d,01}(W_{n2}=W_{min})>I_{d,10}(W_{n1}=W_{min})+I^*_c$. Since $I_d$ is monotonically increasing, $I_{d,10}(W_{n1}=W_{n1,ub})>I_{d,10}(W_{n1}=W_{min})$. Therefore, the first case (FIG. 7A) implies this case. Hence if the first case fails, and this case is true, then:

$$I_{d,10}(W_{n1}=W_{n1,ub})>I_{d,01}(W_{n2}=W_{min})-I^*_c>I_{d,10}(W_{n1}=W_{min})$$

Equation 5 has a solution with $W_{n1}=W_{n1,ub}$, and $W_{n2}=I_{d,01}^{-1}(I_{d,10}(W_{n1}=W_{n1,ub})+I^*_c)$. Note that choosing $W_{n2}=W_{n2,ub}$ will not satisfy Equation 5.

Figure 7D:
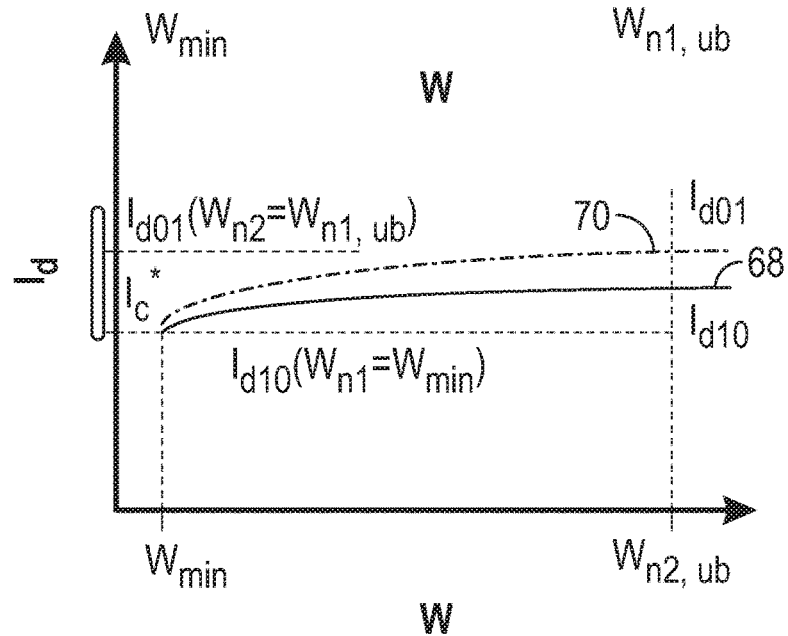

FIG. 7D shows a third case: $I_{d,01}(W_{n2}=W_{n2,ub})<I_{d,10}(W_{n1}=W_{min})+I^*_c$. This corresponds to a situation when $R_L$ and $R_H$ are very close and their magnitudes are high, resulting in lower and flatter $I_d$ curves. Higher resistances might be desired so as to reduce the possibility of a read disturb and improve thermal stability. In this situation, Equation 5 has no solution, and the only option is $W_{n2}=W_{n2,ub}$ and $W_{n1}=W_{min}$. This speeds up the writing of a logic value 1, and slows the writing of a logic value 0, when compared to both transistors being of minimum size.

Figure 7E:
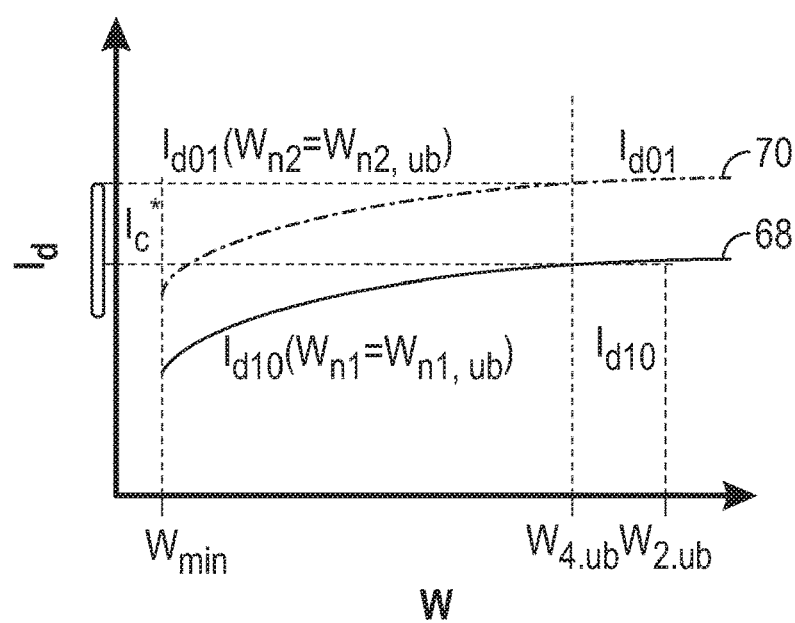

FIG. 7E shows a fourth case: $I_{d,01}(W_{n2}=W_{n2,ub})<I_{d,10}(W_{n1}=W_{n1,ub})+I^*_c$. Since $I_{d,10}(W_{n1}=W_{min})<I_{d,10}(W_{n1}=W_{n1,ub})$, the third case (FIG. 7D) implies this case. Hence if the third case fails, and this case holds, then:

$$I_{d,10}(W_{n1}=W_{n1,ub})>I_{d,01}(W_{n2}=W_{n2,ub})-I^*_c>I_{d,10}(W_{n1}=W_{min})$$

Equation 5 has a solution, which is $W_{n2}=W_{n2,ub}$, and $W_{n1}=I_{d,10}^{-1}(I_{d,01}(W_{n2}=W_{n2,ub})-I^*_c)$.

Figure 7F:
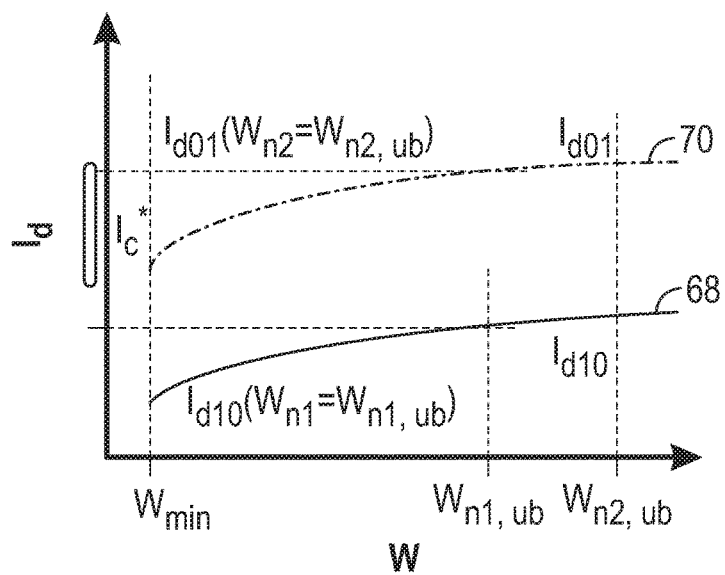

FIG. 7F shows a fifth case: $I_{d,01}(W_{n2}=W_{n2,ub})>I_{d,10}(W_{n1}=W_{n1,ub})+I^*_c$. There is a solution to Equation 5, given by $W_{n1}=W_{n1,ub}$, and $W_{n2}=I_{d,01}^{-1}(I_{10}(W_{n1}=W_{n1,ub})+I^*_c)$. Once again, note that choosing $W_{n2}=W_{n2,ub}$ first, does not lead to a solution.

These five cases are summarized in Procedure EOPT DRIVERSIZE shown in Algorithm 1 below.

---

Algorithm 1

1 EOPTDRIVERSIZE($W_{min}$, $W_{n1,ub}$, $W_{n2,ub}$);
  Output: Energy optimal values of $W_{n1}$, $W_{n2}$
  /* case I                                              */
2 if $I_{d,01}(W_{n2}=W_{min}) > I_{d,10}(W_{n1}=W_{n1,ub}) + I^*_c$ then
3  | $W_{n1} = W_{n1,ub}$;

---

-continued

Algorithm 1

4 | $W_{n2} = W_{min}$;
5 endif
  /* case II                                             */
6 else if $I_{d,10}(W_{n1}=W_{n1,ub}) > I_{d,01}(W_{n2}=W_{min}) - I^*_c > I_{d,10}(W_{n1}=W_{min})$ then
7  | $W_{n1} = W_{n1,ub}$;
8  | $W_{n2} = I_{d,10}^{-1}(I_{d,10}(W_{n1}=W_{n1,ub}) + I^*_c)$;
9 endif
  /* case III                                            */
10 else if $I_{d,01}(W_{n2}=W_{n2,ub}) < I_{d,10}(W_{n1}=W_{min}) + I^*_c$ then
11 | $W_{n1} = W_{min}$;
12 | $W_{n2} = W_{n2,ub}$;
13 endif
  /* case IV                                             */
14 else if $I_{d,10}(W_{n1}=W_{min}) < I_{d,01}(W_{n2}=W_{n2,ub}) - I^*_c < I_{d,10}(W_{n1}=W_{n1,ub})$ then
15 | $W_{n2} = W_{n2,ub}$;
16 | $W_{n1} = I_{d,10}^{-1} I_{d,01}(W_{n2}=W_{n2,ub}) - I^*_c)$;
17 endif
  /* case V                                              */
18 else
19 | $W_{n1} = W_{n1,ub}$;
20 | $W_{n2} = I_{d,01}^{-1} I_{d,10}(W_{n1}=W_{n1,ub}) + I^*_c)$;
21 endif

---

The algorithm for driver sizing described above can be adapted for cases where the parameters of the transistors in the driver circuits 24, 26 and the STT-MTJ cell 16 are subject to manufacturing variations. For the STT-MTJ cell 16, the primary design parameter is its dimension and for the driver circuits 24, 26, the dimensions of the transistors $M_{n1}$, $M_{n2}$, $M_{p1}$, and $M_{p2}$. There are several secondary non-design parameters associated with the STT-MTJ cell 16, such as localized fluctuation of magnetic anisotropy, thermally activated initial procession angle, thermal component of internal energy, and so on.

With regard to the STT-MTJ cell 16, variations in $t_{ox}$ have the greatest impact on its energy consumption, and those variations are predominantly global. This means that a length $L_{MTJ}$ and a width $W_{MTJ}$ of the STT-MTJ cell 16 can be assumed to be fixed at the minimum feature size of the technology, and that the deviations in $t_{ox}$ among different STT-MTJ cells 16 on a given semiconductor die will be the same. On the other hand, the dimensions of the transistors $M_{n1}$, $M_{n2}$, $M_{p1}$, and $M_{p2}$ in the driver circuits 24, 26 are assumed to be subject to both local and global variations. Thus, the widths $W_{n1}$ and $W_{n2}$ are modeled as independent random variables centered around their respective nominal values $\overline{W}_{n1}$ and $\overline{W}_{n2}$, which are to be specified as part of the design.

Figure 8A:
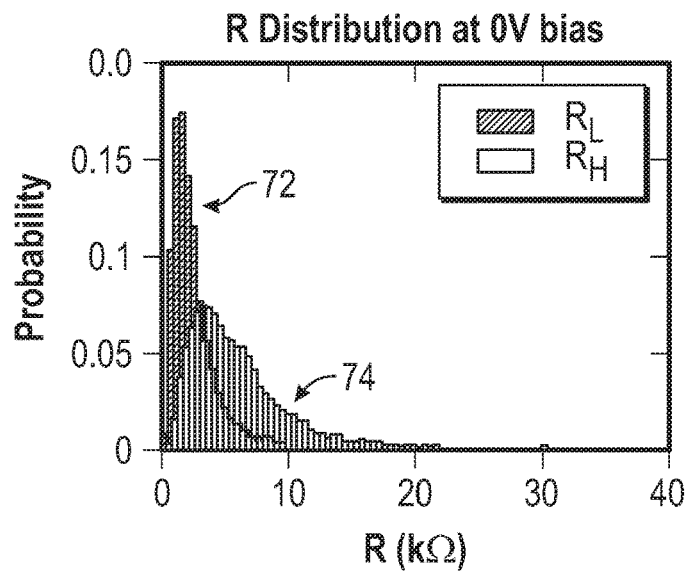
FIG. 8A illustrates frequency histograms for variations in resistance values of the STT-MTJ cell of FIG. 2A.

FIG. 8A illustrates frequency histograms 72, 74 for variations in the resistance values $R_L$ and $R_H$ of the STT-MTJ cell 16 of FIG. 2A. Variations in $t_{ox}$ result in variations in $R_L$ and $R_H$ whose empirical distributions can either be obtained from the measurements or generated by the model equations given in Equation 1. Let $\overline{t}_{ox}$ denote the nominal value. Random zero mean perturbations around $t_{ox}$ are generated using Gaussian distributions. $\overline{t}_{ox}$ is generally not a design variable and is set by the fabrication facility. FIG. 8A shows the frequency histograms for $R_L$ 72 and $R_H$ 74 with 10,000 samples with $\overline{t}_{ox}=8$ nanometers (nm) and $\sigma t_{ox}=0.1\,\overline{t}_{ox}$.

Figure 8B:
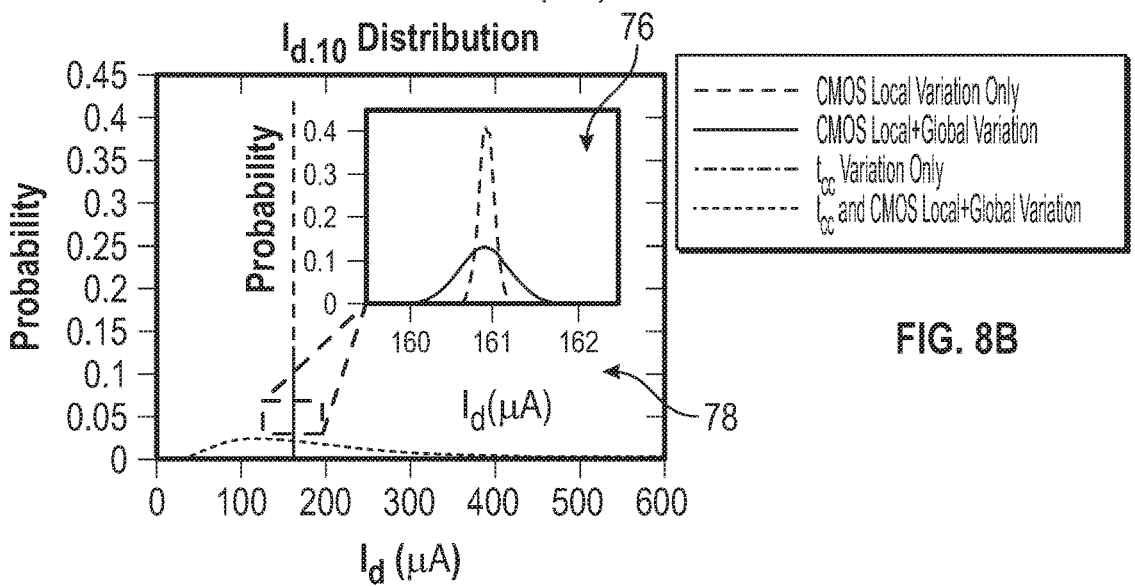
FIG. 8B shows frequency histograms of driver current in the driver circuits 24, 26 of FIG. 2A, assuming different sources of variations.

FIG. 8B shows frequency histograms of $I_d$ in the driver circuits 24, 26 of FIG. 2A, assuming different sources of variations. Variations in $t_{ox}$ and driver transistor widths will result in corresponding variations in the driver currents. An inset plot 76 shows the histogram of $I_d$ considering local and global variations only in the driver transistors, and an outer plot 78 includes variations in the transistor dimensions and t of the STT-MTJ cell 16. The plots indicate that variations in $t_{ox}$ overwhelm the effect of variations in the transistors' dimensions. However, in the interest of generality and applicability to scaled geometries, the currents $I_{d,01}$ and $I_{d,10}$ are modeled as a function of a collection of random variables over the parameter space ($W_{n1}$, $W_{n2}$, $t_{ox}$).

Figure 8C:
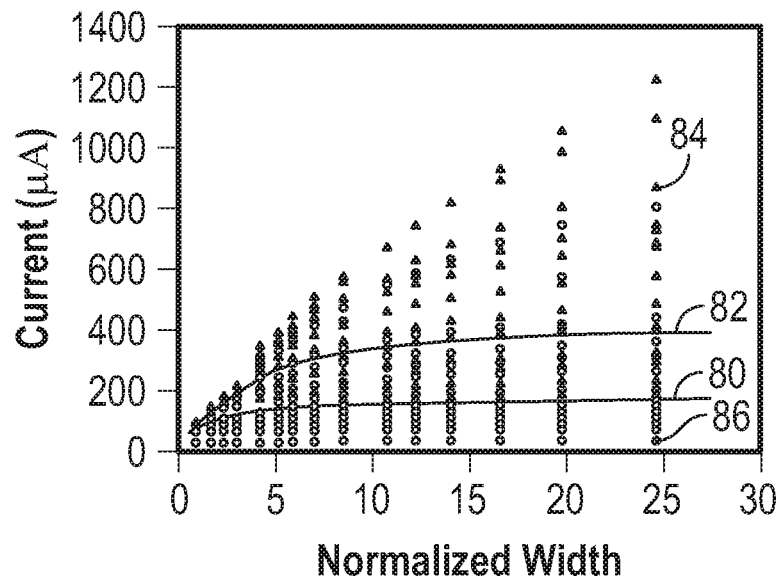
FIG. 8C shows plots of driver current as a function of normalized widths of the transistors of the driver circuits of FIG. 2A.

FIG. 8C shows plots of $I_d$ as a function of normalized widths of the transistors of the driver circuits 26, 28 of FIG. 2A. A first solid curve 80 and a second solid curve 82 correspond to a case where no variations are considered in the transistor dimensions or in the $t_{ox}$ of the STT-MTJ cell 16. The solid curves 80, 82 correspond to those in FIG. 7A. Individual population plots (10,000) of $I_{d,01}$ 84 and $I_{d,10}$ 86 values generated by Monte Carlo simulations, by varying ($W_{n1}$, $W_{n1}$, $t_{ox}$) around their nominal values [$\overline{W}_{n1,i}$, $\overline{W}_{n2,j}$, $\overline{t}_{ox}$], for (i,j)∈[1, n]. Let $S(\overline{W}_{n1}, \overline{W}_{n2}, \overline{t}_{ox})$ denote the population of samples centered at ($\overline{W}_{n1}$, $\overline{W}_{n2}$, $\overline{t}_{ox}$).

If the populations were ignored and only the nominal values were used, then Procedure EOPTDRIVERSIZE would return a pair [$\overline{W}_{n1,i}$, $\overline{W}_{n2,j}$] for some (i,j). Then the corresponding backup time denoted by $\overline{\tau}_{i,j}$, would be the mean value of the distribution of $\tau_{i,j}$ centered around [$\overline{W}_{n1,i}$, $\overline{W}_{n2,j}$].

The above approach may be improved by considering manufacturing yield. Yield is defined as the fraction of driver circuits 24, 26 that would succeed in writing a value 1 and a value 0. With $\tau$ as a random variable, $\overline{\tau}$ by definition will be its mean. Choosing $\overline{\tau}$ as the backup time would mean that all the outcomes (driver designs) from the corresponding population $S(\overline{W}_{n1}, \overline{W}_{n2}, \overline{t}_{ox})$ whose backup time exceeds $\overline{\tau}$ would have failed in writing a 0 or a 1. If the distribution of $\tau$ was symmetric about its mean, then the yield would be 50%. Hence, the problem is to determine the driver widths that minimize the backup energy subject to a yield constraint.

Yield y is defined as the fraction of dice with drivers that would be able to successfully switch the state of the STT-MTJ cell 16 from $R_L$ to $R_H$ and vice versa. Given a required yield y, let $\tau_y$ denote the single, global backup time that results in a yield of y. Yield and energy are related. To see how to compute energy as a function of yield, consider samples of $I_d$ shown in FIG. 8C. Each pair of data points within a population has an associated backup time $\tau_{01}$ and $\tau_{10}$, that can be computed using Equation 3. The corresponding total energy would be calculated by Equation 4 where $\tau=\tau_y$. This energy is computed for all the samples in a given population whose backup times fall within the y percentile, for a given yield y.

Figure 9:
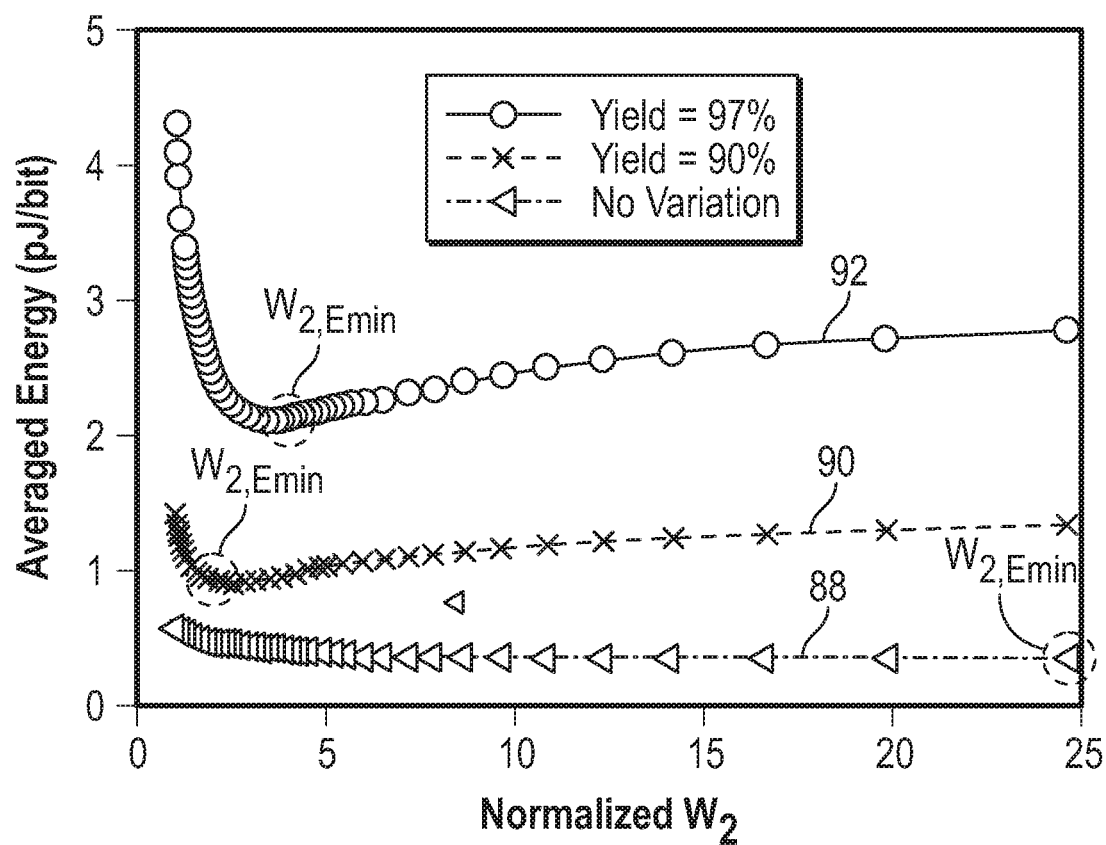
FIG. 9 shows plots of average energy versus driver width for several values of yield.

FIG. 9 shows plots 88, 90, 92 of average energy versus driver width for several values of yield y. Unlike the deterministic case (see FIG. 7A), the minimum of the average energy does not necessarily correspond to the largest value of the transistor width (i.e. maximum current) but instead to some intermediate value. The smaller $W_{n1}$ implies lower current and longer backup time.

The procedure to determine the nominal widths of the driver transistors in the presence of process variations is shown in Algorithm 2 below:

---

Algorithm 2

1 EOPTDRIVERSIZEWPR([$W_{min}$, $W_{ub}$], $t_{ox}$, Y);
 Output: Energy optimal values of $\overline{W}_{n1}$, $\overline{W}_{n2}$, and $\tau_y$
2 i = 1;
3 $\overline{W}_{n1,0}$ = $W_{n1,ub}$;

---

-continued

Algorithm 2

4 $\overline{W}_{n2,0}$ = $W_{n2,ub}$;
5 $E_{avg,0}$ = ∞;
6 while $\overline{W}_{min}$ ≤ $\overline{W}_i$ ≤ $\overline{W}_{ub}$ do
7 | [$\overline{W}_{n1,i}$, $\overline{W}_{n2,i}$] = EOPTDRIVERSIZE($\overline{W}_{min}$, $\overline{W}_{n1,i-1}$ ≤ $\overline{W}_{n2,i-1}$);
 | /* Generate N MonteCarlo samples */
8 | $S_j$ = ($W_{n1,i,j}$, $W_{n2,i,j}$, $t_{ox,j}$) = MC($\overline{W}_{n1,i}$, $\overline{W}_{n2,i}$, $\overline{t}_{ox}$);
9 | for j = 1: N do
 | | /* Find driving current by HSPICE simulation */
10 | | ($I_{d,01,j}$, $I_{d,10,j}$) = HSPICE($S_j$);
11 | | ($\tau_{01,j}$, $\tau_{10,j}$) = Eqn 3 ($I_{d,01,j}$, $I_{d,10,j}$);
12 | | $\tau_{01,j}$ = max($\tau_{01,j}$, $\tau_{10,j}$)
13 | end
 | /* y % of switching times ≤ $\tau_y$ */
14 | $\tau_y$: Prob ($\tau \le \tau_y$) = y;
15 | for j = 1: N do
16 | | if $\tau \le \tau_y$ then
17 | | | $E_j$ = Eqn 4 ($\tau_y$, $\tau_{01,j}$, $\tau_{10,j}$, $I_{d,01,j}$, $I_{d,10,j}$)
18 | | endif
19 | end
20 | $E_{avg,i}$ = ($E_1$ + $E_2$ + . . . + $E_N$)/(YN);
21 | if $E_{avg,i}$ > $E_{avg,i-1}$ then
22 | | return $\overline{W}_{n1,i-1}$ + ΔW, $\overline{W}_{n2,i-1}$ + ΔW,$\tau_y$;
23 | endif
24 | $\overline{W}_{n1,i}$ = $\overline{W}_{n1,i}$ − ΔW;
25 | $\overline{W}_{n2,i}$ = $\overline{W}_{n2,i}$ − ΔW;
26 | i = i + 1
27 end

---

The objective is to identify the nominal values ($\overline{W}_{n1}$, $\overline{W}_{n2}$) that define a population $S(\overline{W}_{n1}, \overline{W}_{n2}, \overline{t}_{ox})$ whose ensemble average energy computed over all those outcomes whose backup times fall below $\tau_y$ (the y percentile value of the backup time) is minimum. A non-parametric or data-driven approach is warranted, using the empirical distribution of currents generated by Monte Carlo simulation to compute averages. As the set of transistor widths form a discrete set, the procedure starts with setting the nominal values to their respective upper bounds (lines 3, 4), and iterates over the discrete set (line 6). Procedure EOPTDRIVERSIZE is used to determine the next nominal value around which to generate the sample population (line 7), and then the backup times and currents are computed for each sample point (lines 8-11). The average of the samples whose backup times are within the y percentile value is computed (lines 14-17). The minimum average energy value is retained, and the procedure terminates as soon the average starts to increase (lines 20, 21).

FIG. 9 shows that higher yield requires higher energy expenditure. One way to reduce backup energy is to boost the voltage. However, this is not practical for the type of low voltage, low power ASICs and similar processing units employing energy harvesting used in AES. Techniques for improving the energy efficiency by balancing the backup times used in non-volatile memory are not applicable for NVFFs. For this reason, the procedure described in Algorithm 2 above minimizes the average energy under a yield constraint by sizing the drivers separately. Other techniques that improve the write margin by increasing the driver size (to increase $I_d$) and the backup time result in high energy consumption. Device engineering can also be done to trade retention time with write energy.

The backup time $\tau_y$ determined by procedure EOPTDRIVERSIZEWPR ensures that, with a high probability, y % of the dice will succeed in backup of a logic value 1 and a logic value 0. However, the conservative choice of $\tau_y$ results in wasted energy for most of the dice. This motivates the adaptive approach of determining the backup time on a per-chip basis. For this reason, the non-volatile logic device 10 in an exemplary aspect is equipped with a scan mechanism which allows for dynamically testing and adjusting the backup time to minimize the backup energy. This scan mechanism is compatible with the normal scan available on traditional flip-flops, and hence has minimum hardware cost.

Figure 10:
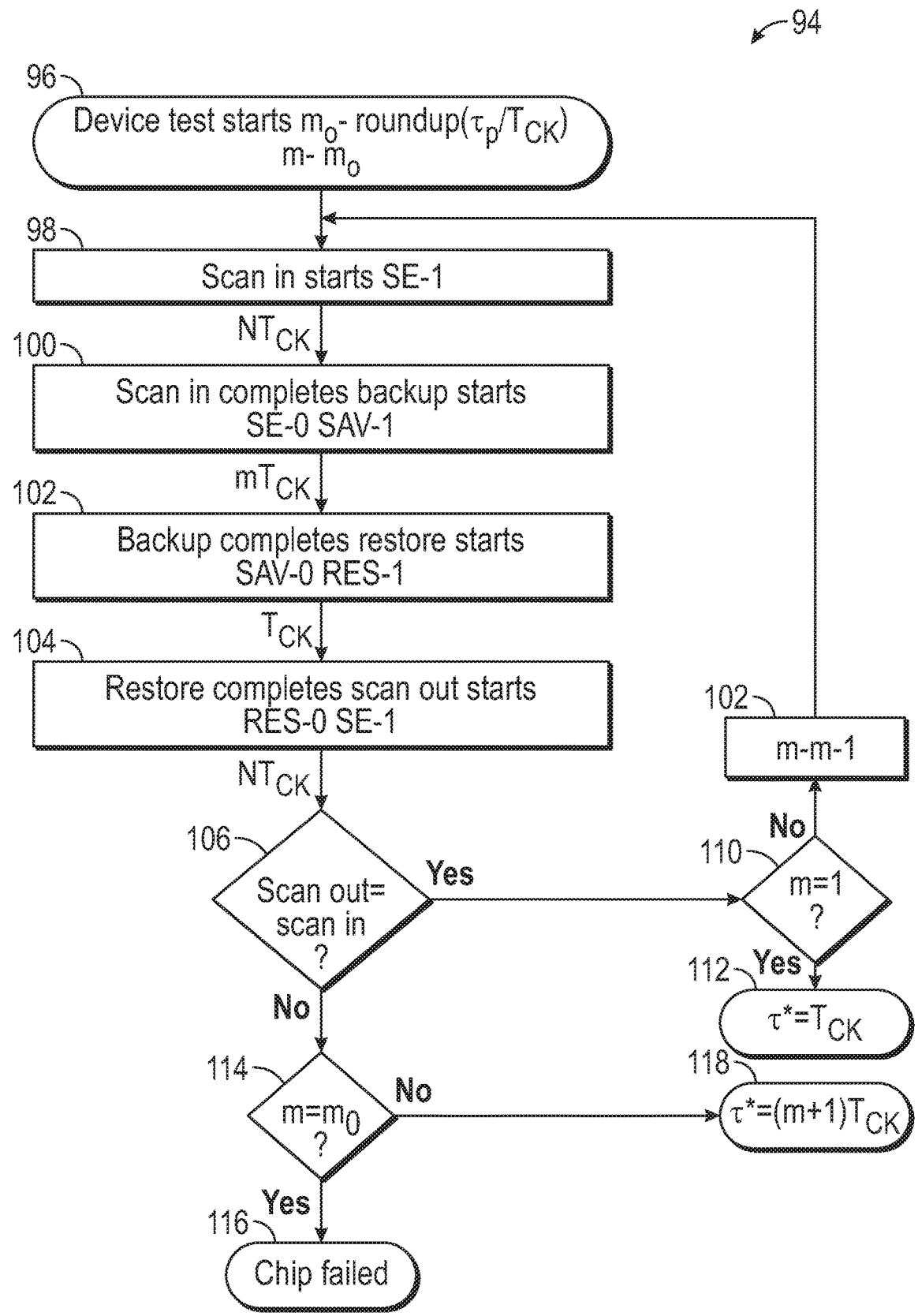
FIG. 10 illustrates a non-volatile scan test procedure to determine a minimum backup time of a processing unit incorporating the non-volatile logic device of FIG. 1.

FIG. 10 illustrates a non-volatile scan test procedure 94 to determine a minimum backup time $\tau^*$ of a processing unit incorporating the non-volatile logic device 10 of FIG. 1. If $\tau$ is the backup time computed by procedure EOPT DRIVERSIZEWPR (see Algorithm 2), then the least number of clock cycles whose total duration exceeds $\tau$ is $$M(\tau) = \text{roundup}\left(\frac{\tau}{T_{CK}}\right).$$

In FIG. 10 this is initialized to $m=m_0=m(\tau_y)$ (block 96). Then data is scanned into N non-volatile logic devices 10 of the processing unit (block 98), and the backup mode is made active (e.g., the backup signal SAV=1) for m cycles (block 100). Next, a restore is performed (block 102), and the data is scanned out (block 104). If there are no differences between the data scanned in and scanned out (block 106), then m cycles was sufficient. Therefore m is decremented (block 108), the procedure is repeated. If m=1 has been reached (block 110), the minimum backup time is $\tau^*=T_{CK}$ (block 112). If on some iteration, the scanned out values differ from the scanned in values, then the number of cycles was not sufficient. If this happens on the first iteration, where $m=m_0$ (block 114), then this chip is considered to have not met the yield criterion and deemed to have failed (block 116). On the other hand, if the error appears on some value of m other than the first, then the previous iteration succeeded, and m is incremented and the minimum backup time is $\tau^*=(m+1)T_{CK}$ (block 118).

Figure 11:
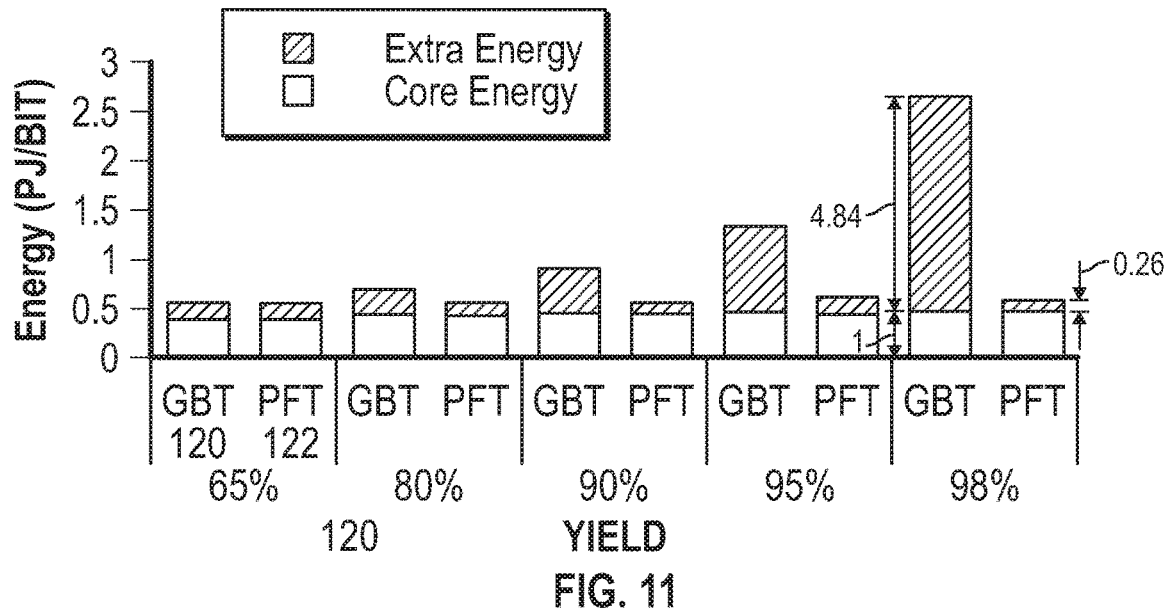
FIG. 11 shows energy expenditure using two different backup times a global backup time and post-fabrication tuning.

FIG. 11 shows the energy expenditure using two different backup times—a global backup time (GBT) 120 using $\tau_y$, and a post-fabrication tuning (PFT) 122 using $\tau^*$. The savings in energy using the PFT 122 for a yield of 98% is nearly 80% compared to using the GBT 120. In some embodiments, $\tau^*$ may be computed using procedure EOPT-DRIVERSIZEWPR with $\tau_y$ in line 15 being replaced by $\tau_j$, and updating $E_j$ in line 17 only if $\tau_j \leq \tau_y$.

Figure 12:
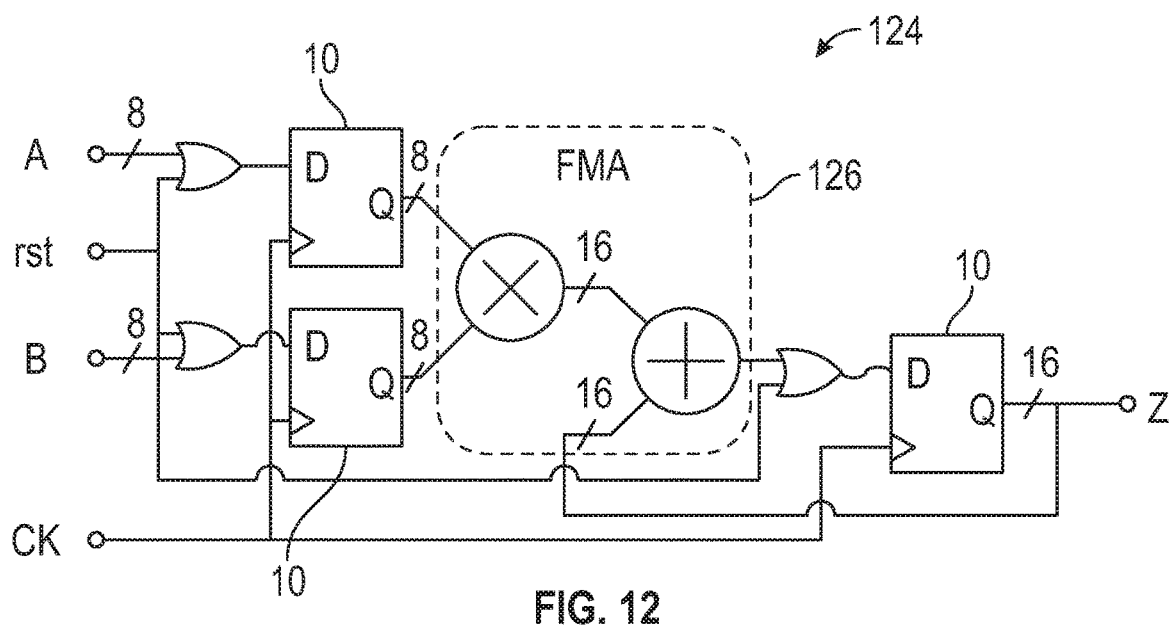
FIG. 12 is a schematic diagram of an 8-bit multiply-and-accumulate (MAC) unit which incorporates input and output non-volatile logic devices, a synchronous reset, and a fused multiply-add (FMA) unit.
Figure 13A:
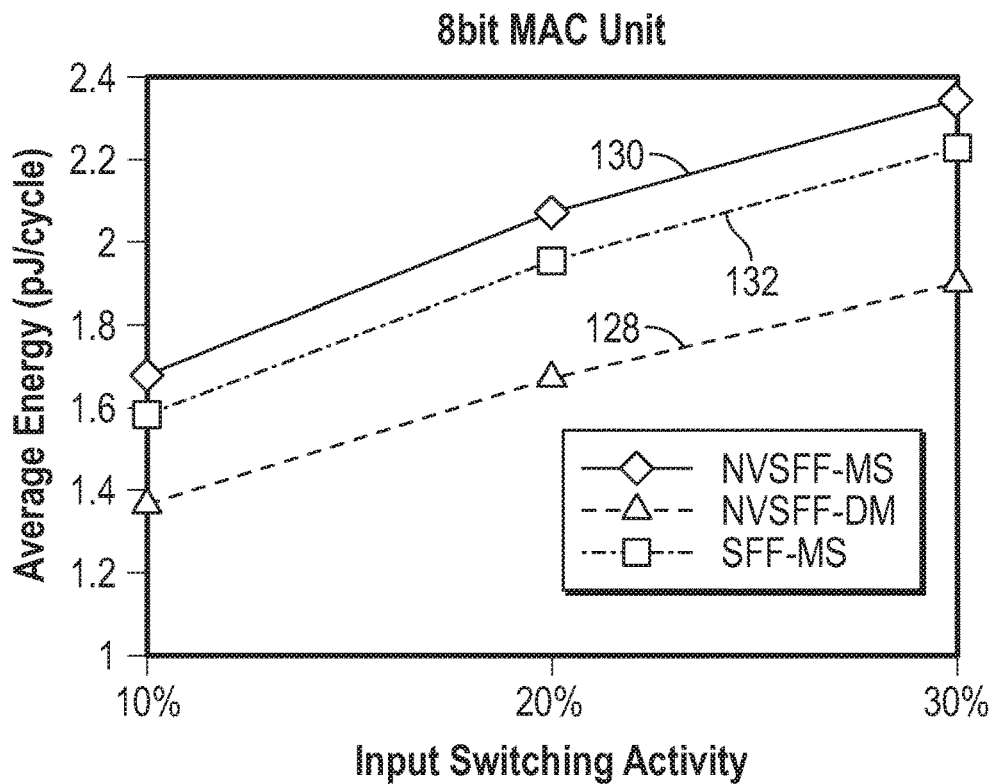
FIG. 13A illustrates total energy versus input switching activity under normal operation for the 8-bit MAC unit of FIG. 12.
Figure 13B:
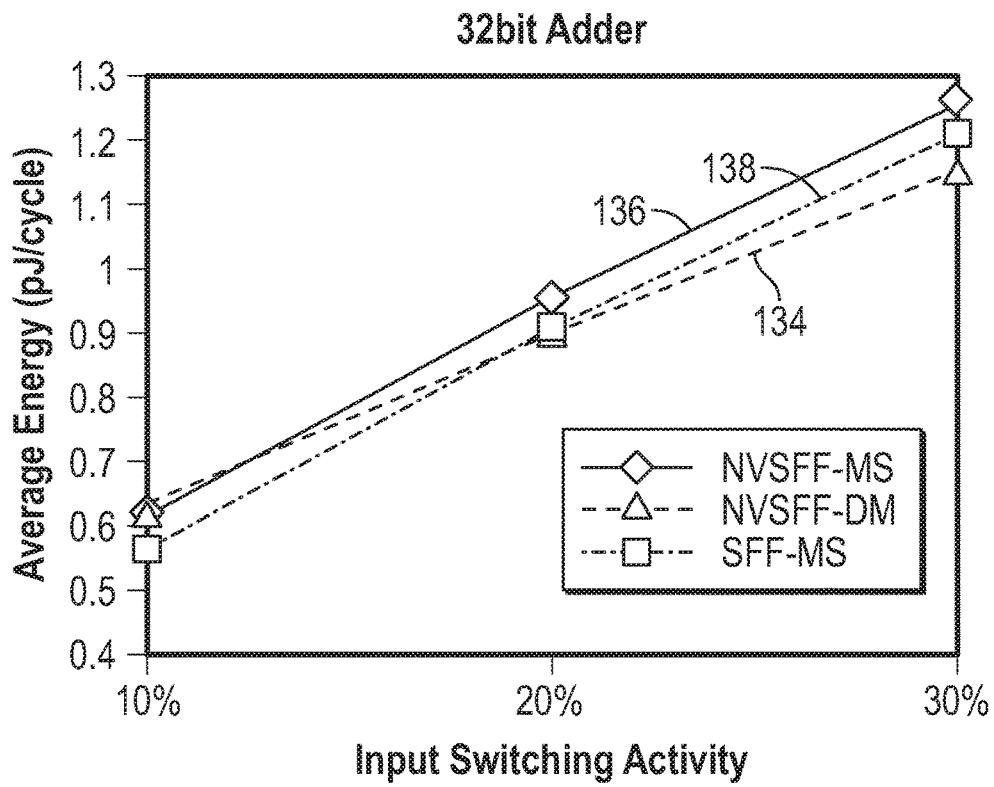
FIG. 13B illustrates total energy versus input switching activity under normal operation for a 32-bit adder similar to the 8-bit MAC unit of FIG. 12.

Simulation results for the proposed non-volatile logic device 10, as well as the results on a larger design incorporating the non-volatile logic device 10, are described with respect to FIGS. 12, 13A, and 13B. The simulation results are based on a commercial 40 nm process. Other standard cells in 40 nm were used in circuit automated synthesis.

The non-volatile logic devices 10 include STT-MTJ cells 16 (as in FIG. 2A), each of which has a square shape top view with both width and length equal to 40 nm. Other parameters are shown in Table I, below. As $t_{ox}$ is the most significant factor on energy consumption, to simplify the analysis, perturbations in $t_{ox}$ are assumed to be Gaussian. To study the impact of the variations in $t_{ox}$ on the resistances of the STT-MTJ cells 16, 10,000 Monte Carlo simulations were performed with the mean $\mu t_{ox}$ and sigma $\sigma t_{ox}$ of $t_{ox}$ set to 8 nm and 10% of mean. Other physical parameters remained constant. FIG. 8A shows the distribution of $R_L(0)$ and $R_H(0)$. The mean and sigma of the resistances are summarized in Table II below. $I_{c,01}$ is 78.71 micro amperes (µA) and $I_{c,10}$ is 27.77 µA. If a single power supply is used in design of the non-volatile logic devices 10, the maximum voltage drop across a STT-MTJ cell 16 may not exceed its $V_{dd}$, which is 0.9 volts (V) in an example 40 nm device. Therefore, the maximum resistance can be calculated as:

$$R_{H,max}=V_{dd}/I_{c,10}=32.4 k\Omega,$$

$$R_{L,max}=V_{dd}/I_{c,01}=11.43 k\Omega.$$

Table II shows the mean and standard deviation of resistances for two different mean values of $t_{ox}$. A smaller t is preferred to ensure that the 3σ of $R_L$ and $R_H$ are below the maximum resistances dictated by the power supply. Based on Table II, $\mu t_{ox} 0.8$ nm and $\sigma t_{ox}=10\% \mu t_{ox}$ is assumed.

TABLE I

STT-MTJ PARAMETERS.

| Parameter | Value |
|---|---|
| MgO thickness (µ) | 0.8 nm, 0.85 nm |
| Free layer thickness | 1.3 nm |
| Area | 40 nm × 40 nm |
| Resistance area product | 5 Ω · µm² |
| TMR at zero bias | 150% |
| STD of variation (σ) | 3%, 5%, 10% [28] |
| MonteCarlo cases | 10000 |

TABLE II

MEAN AND STANDARD DEVIATIONS OF STT-MTJ RESISTANCES VERSUS $t_{ox}$. THE MEAN OF RANDOM VARIABLE $t_{ox}$ IS SET TO TWO VALUES, 8.5 nm AND 8 nm, WITH SIGMA EQUAL TO 3%, 5% AND 10% OF $t_{ox}$.

| $\mu_{tox}$ (nm) | $\sigma_{tox}$ (%) | $\mu_{RH}$ (kΩ) | $\sigma_{RH}$ (kΩ) | $\mu_{RL}$ (kΩ) | $\sigma_{RL}$ (kΩ) |
|---|---|---|---|---|---|
| 8.5 | 10% | 9.59 | 6.91 | 3.84 | 2.76 |
|  | 5% | 8.23 | 2.74 | 3.29 | 1.09 |
|  | 3% | 7.96 | 1.57 | 3.18 | 0.62 |
| 8 | 10% | 6.39 | 4.33 | 2.56 | 1.73 |
|  | 5% | 5.57 | 1.75 | 2.23 | 0.70 |
|  | 3% | 5.41 | 1.01 | 2.16 | 0.40 |

Table III shows the delay and the energy delay product of the non-volatile logic device 10 incorporating the differential flip-flop 44 (NVSFF-DM) of FIG. 5A or the master-slave flip-flop 56 (NVSFF-MS) of FIG. 6A as well as a volatile master-slave scan flip-flop (SFF-MS) design. The setup time ($T_{setup}$) of the differential flip-flop 44 is negative, in contrast to the positive setup time of the master-slave flip-flop 56. Hence the total delay of the differential flip-flop 44 is less than that of the master-slave flip-flop 56. Compared to the master-slave flip-flop 56, the average energy consumption (measured with 30% input switching activity) is higher in the differential flip-flop 44, but the energy-delay product (EDP) is similar due to the lower total delay of the differential flip-flop 44. The total delay of the SFF-MS design is between the two non-volatile logic device 10 designs, but its energy and EDP are less.

A reference STT-MTJ cell 16 (reference transistor 30) is required in the state sense amplifier 32 (see FIG. 3A). The resistance of the reference transistor 30 ($R_{ref}$) is between $R_H$ and $R_L$. Since the state recovery is implemented by the sensing current flow, $R_{ref}$ is set to be the harmonic mean of $R_H$ and $R_L$, such that $$\frac{1}{R_{ref}} = 2\left(\frac{1}{R_H} + \frac{1}{R_L}\right).$$

The resistance $R_{ref}$ of the reference transistor 30 is achieved by changing the dimension of the STT-MTJ cell 16 to 55 nm×50 nm, and $R_{ref}$ is 3.09 kΩ. The recovery time of two designs are shown in Table IV. In some cases, global perturbations in $t_{ox}$ may be significant source of variations in the device resistances. Therefore, relative differences between $R_{ref}$ and $R_H/R_L$ would remain constant on a die.

TABLE III

PERFORMANCE OF NVSFF-MS, NVSFF-DM AND SFF-MS. THE AVERAGE ENERGY IS BASED ON 30% INPUT SWITCHING ACTIVITY. SIMULATION CONDITIONS ARE: 25° C., 0.9 V, TT CORNER, AND OUTPUT LOAD OF 3fF.

|  | $T_{C2Q}$ (ps) | $T_{setup}$ (ps) | $T_{total}$ (ps) | Energy (fJ/cyc) | EDP (fJ · ps) |
|---|---|---|---|---|---|
| NVSFF-MS | 60.28 | 6.90 | 67.18 | 4.10 | 275.56 |
| NVSFF-DM | 46.99 | −2.99 | 44.00 | 5.99 | 263.51 |
| SFF-MS | 38.08 | 16.74 | 54.82 | 2.218 | 121.59 |

TABLE IV

DELAY AND ENERGY OF BACKUP DRIVER CONSIDERING VARIATIONS IN BOTH MTJ AND CMOS.

|  | Recover '0' | | Recover '1' | |
|---|---|---|---|---|
|  | Delay (ps) | Energy (fJ/bit) | Delay (ps) | Energy (fJ/bit) |
| NVSFF-MS | 107.7 | 15.02 | 142.3 | 13.5 |
| NVSFF-DM | 83.87 | 17.75 | 82.84 | 19.41 |

Table V shows a comparison of the master-slave flip-flop 56 (NVSFF-MS) and the differential flip-flop 44 (NVSFF-DM) with published data on two other designs. Ref. [11] (Khanna, et al., "An FRAM-based nonvolatile logic MCU SoC exhibiting 100% digital state retention at vdd=0 v achieving zero leakage with ¡ 400-ns wakeup time for ULP applications," *IEEE Journal of Solid-State Circuits*, vol. 49, no. 1, pp. 95-106, January 2014) describes the design of a non-volatile system on a chip with NVMAs. During backup and restore, data is transferred between normal (volatile) flip-flops and a 256-bit non-volatile memory array through a 32-bit 8 to 1 multiplexer (MUX). It needs 8 write/read cycles to complete the serial backup/restore procedure. Each write/read cycle takes 5/6 clock periods, respectively. Compared to differential flip-flop 44 (NVSFF-DM) cells, the backup and restore operations of the NVMAs consume much more time and energy. Ref. [4] (Natsui, et al., "Non-volatile logic-in-memory array processor in 90 nm MTJ/MOS achieving 75% leakage reduction using cycle based power gating," in 2013 *IEEE International Solid-State Circuits Conference Digest of Technical Papers*, February 2013, pp. 194-195) describes a non-volatile flip-flop which has a large positive setup time, and requires a DC current while reading the state of the STT-MTJ.

TABLE V

COMPARISON OF NON-VOLATILE FLIPFLOP WITH PRIOR REPORTED DATA.

|  | NVSFF-MS | NVSFF-DM | Ref. [11] | Ref. [4] |
|---|---|---|---|---|
| Technology | 40 nm | 40 nm | 130 nm | 45 nm |
| $T_{setup}$ | 6.0 ps | −3.0 ps | N/A | 75.2 ps |
| $T_{C2Q}$ | 60.3 ps | 47.0 ps | N/A | 203.3 ps |

TABLE V-continued

COMPARISON OF NON-VOLATILE FLIPFLOP WITH PRIOR REPORTED DATA.

|  | NVSFF-MS | NVSFF-DM | Ref. [11] | Ref. [4] |
|---|---|---|---|---|
| Backup time | Tunable | | 320 ns | N/A |
| Backup energy | 504 fJ/bit | | 2200 fJ/bit | N/A |
| Restore time | 142.3 ps | 83.9 ps | 384 ns | 2.01 ns |
| Restore energy | 15.92 fJ/bit | 19.41 fJ/bit | 660 fJ/bit | 170.9 fJ/bit |

Table VI shows the energy consumption of the NVSU 14 during the backup mode. Three driver sizes were examined to evaluate their effect on the energy consumption. The driver sizes were determined based on the method described above. Ignoring variations, the minimum energy is achieved with the largest driver size (107.5). When both complementary metal-oxide semiconductor (CMOS) and MTJ variations are included, the single global backup time $\tau_{97}$=14.6 ns, whereas the chip-specific backup times ranged from 1.96 nanoseconds (ns) to 12.84 ns (over 10,000 samples). However the energy expenditure of the former was more than 3.5× than the latter. Moreover, the sizing and PFT approach results in an energy expenditure that is close to the ideal case with no variations.

TABLE VI

COMPARISON OF BACKUP SCHEMES. (A) AND (B) USE SINGLE BACKUP TIME FOR ALL DICE, AND (C) REFERS TO CHIP-SPECIFIC BACKUP TIME. (B) AND (C) INCLUDE VARIATIONS IN BOTH CMOS AND MTJ.

|  | Yield | Driver Size | τ (us) | Energy (pJ/bit) |
|---|---|---|---|---|
| (A) No Variation | 100% | 107.5 | 2.17 | 0.367 |
| (B) Global Backup Time | 97% | 20.9 | 14.6 | 1.811 |
| (C) Post Fab. Tuning | 97% | 32.8 | 1.96-12.84 | 0.504 |

Both the non-volatile logic device 10 designs described above are characterized using a standard characterization tool. To demonstrate the performance impact of the non-volatile logic device 10 designs on larger circuits, two circuits, an 8-bit multiply-and-accumulate (MAC) unit, and a 32-bit adder were synthesized using the two different non-volatile logic device 10 (NVSFF-DM and NVSFF-MS) and a SFF-MS.

FIG. 12 is a schematic diagram of an 8-bit MAC unit 124 which incorporates input and output non-volatile logic devices 10, a synchronous reset, and a fused multiply-add (FMA) unit 126. The MAC unit 124 was synthesized using with two different combinations of standard cells: (1) standard logic with the differential flip-flop 44 (NVSFF-DM) of FIG. 5A and (2) standard logic with the master-slave flip-flop 56 (NVSFF-MS) of FIG. 6A. Note that the total number of non-volatile logic devices 10 (16 input and output) in both designs is the same, and both were synthesized for the same target clock period of 1.835 ns. The 32-bit adder is designed in a similar manner. Embodiments of the disclosure may allow conversion of any processing unit (e.g., ASIC) design to one that is completely non-volatile using commercial synthesis flows.

Table VII shows results of the synthesis. The column Cell Count indicates the total number of standard cells. The design with NVSFF-DMs has 11.6% fewer cell counts and 16% less area compared with the one with NVSFF-MSs. Even though NVSFF-DM consumes higher power, its smaller (negative) setup time allows the synthesis tool to reduce the logic cone driving the flip-flop to a greater degree than in the case of the NVSFF-MS.

FIG. 13A illustrates total energy versus input switching activity under normal operation for the 8-bit MAC unit 124 of FIG. 12. Power estimation was done with input sequences with 10%, 20% and 30% switching activities were supplied to the circuit. The average energy was measured by averaging the energy consumption across more than 100 cycles. As illustrated in FIG. 13A, the MAC unit 124 with a NVSFF-DM 128 consumed about 18.7%, 18.9% and 19% less energy than the MAC unit 124 with a NVSFF-MS 130. As with delay (see Table III), both area and energy consumption of the MAC unit using a SFF-MS 132 are between the MAC unit designs using the NVSFF-DM 128 and the NVSFF-MS 130.

FIG. 13B illustrates total energy versus input switching activity under normal operation for the 32-bit adder similar to the 8-bit MAC unit 124 of FIG. 12. There are 97 non-volatile logic devices 10 in the design. The synthesized results are shown in Table VII. The design with NVSFF-DMs 134 has only 3.5% fewer cells and 7% smaller area than the one with NVSFF-MSs 136. The energy consumption results with three switching activities are also very close, about 0.9%, 5.8% and 7.2% fewer on the NVSFF-DMs 134. Compared with the MAC unit 124, the 32-bit adder has fewer logic cells and more flip-flops. The NVSFF-DM 134 has lower total delay (setup plus clock-to-Q) but slightly higher power consumption than the NVSFF-MS 136. The reduced delay allows synthesis tools to absorb the extra slack by reducing the size of the logic cone driving the flip-flop. For the 32-bit adder, the reduction in the size of its logic cones when using the NVSFF-DM 134 may not sufficient to compensate for its larger power consumption due to its greater number of flip-flops. Since SFF-MS is smaller than NVSFFs, the total area of the adder with a SFF-MS 138 is 10.4% and 16.6% smaller than the one with the NVSFF-DMs 134 and NVSFF-MSs 136, respectively.

TABLE VII

COMPARISON OF LOGIC CELL COUNT AND AREA USING DIFFERENT FLIPFLOPS IN MAC AND ADDER.

| Flipflop Type | MAC unit | | 32-bit Adder | |
| --- | --- | --- | --- | --- |
| | Cell Count | Area ($\mu m^2$) | Cell Count | Area ($\mu m^2$) |
| NVSFF-MS | 603 | 3040 | 482 | 2517 |
| NVSFF-DM | 533 | 2555 | 465 | 2342 |
| SFF-MS | 580 | 2795 | 477 | 2098 |

Those skilled in the art will recognize improvements and modifications to the preferred embodiments of the present disclosure. All such improvements and modifications are considered within the scope of the concepts disclosed herein and the claims that follow.

What is claimed is:

1. A non-volatile logic device on a semiconductor die, the non-volatile logic device comprising:
a volatile scan flip-flop comprising a first differential node and a second differential node; and
a non-volatile storage unit coupled to the volatile scan flip-flop and comprising:
a first write buffer coupled to the first differential node;
a second write buffer coupled to the second differential node; and
a data transistor coupled between a first output of the first write buffer and a second output of the second write buffer;
wherein:
during a backup mode, the non-volatile storage unit stores a state of the volatile scan flip-flop; and
upon loss of power to the non-volatile logic device, the non-volatile storage unit retains the stored state.

2. The non-volatile logic device of claim 1, wherein:
the data transistor is configured to store the state of the volatile scan flip-flop; and
the non-volatile storage unit further comprises a reference transistor configured as a reference during a restore mode.

3. The non-volatile logic device of claim 2, wherein the data transistor comprises a spin-transfer torque magnetic tunnel junction (STT-MTJ).

4. The non-volatile logic device of claim 2, wherein the data transistor comprises a spin orbit torque magnetic tunnel junction (SOT-MTJ).

5. The non-volatile logic device of claim 2, wherein the first write buffer and the second write buffer are configured to set direct current through the data transistor during the backup mode.

6. The non-volatile logic device of claim 2, wherein the non-volatile storage unit further comprises a state sense amplifier circuit configured to set an output of the non-volatile storage unit during the restore mode.

7. The non-volatile logic device of claim 6, wherein the state sense amplifier circuit is further configured to set the output based on sensing a conductance difference between a first path through the data transistor and a second path through the reference transistor.

8. The non-volatile logic device of claim 1, wherein the volatile scan flip-flop comprises a differential flip-flop.

9. The non-volatile logic device of claim 8, wherein a differential sense amplifier couples the differential flip-flop to the non-volatile storage unit during the backup mode.

10. The non-volatile logic device of claim 1, wherein the volatile scan flip-flop comprises a master-slave flip-flop having a master latch and a slave latch.

11. The non-volatile logic device of claim 10, wherein the non-volatile storage unit couples to differential nodes of the slave latch during the backup mode.

12. A non-volatile flip-flop, comprising:
a volatile flip-flop comprising a first differential node and a second differential node; and
a non-volatile storage unit coupled to the volatile flip-flop, comprising:
a first write buffer coupled to the first differential node;
a second write buffer coupled to the second differential node; and
a data spin transfer torque magnetic tunnel junction (STT-MTJ) coupled between a first output of the first write buffer and a second output of the second write buffer and configured to:
store a state of the volatile flip-flop during a backup mode; and
be inactive during a normal mode.

13. The non-volatile flip-flop of claim 12, wherein an output of the non-volatile storage unit couples to the volatile flip-flop to restore the state during a restore mode.

14. The non-volatile flip-flop of claim 13, wherein:
the volatile flip-flop comprises a scan flip flop; and
a timing of at least one of the backup mode or the restore mode is tunable.

15. The non-volatile flip-flop of claim 13, wherein the non-volatile storage unit is configured to return to the normal mode after the restore mode.

16. The non-volatile flip-flop of claim 12, wherein the non-volatile storage unit further comprises a reference STT-MTJ.

17. The non-volatile flip-flop of claim 16, wherein the non-volatile storage unit further comprises a state sense amplifier circuit coupled between the data STT-MTJ and the reference STT-MTJ and is configured to output the stored state to the volatile flip-flop during a restore mode.

18. The non-volatile flip-flop of claim 17, wherein during the restore mode:
current conducts through a first current path through the data STT-MTJ and a second current path through the reference STT-MTJ; and
the state sense amplifier circuit senses a conductance difference between the first path and the second path.

\* \* \* \* \*